(12) United States Patent
Fisher et al.

(10) Patent No.: US 10,327,343 B2
(45) Date of Patent: *Jun. 18, 2019

(54) APPLYING PRESSURE TO ADHESIVE USING CTE MISMATCH BETWEEN COMPONENTS

(71) Applicant: INTERNATIONAL BUSINESS MACHINES CORPORATION, Armonk, NY (US)

(72) Inventors: Michael J. Fisher, Poughkeepsie, NY (US); David C. Long, Wappingers Falls, NY (US); Donald Merte, Poughkeepsie, NY (US); Robert Weiss, Poughkeepsie, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 396 days.

This patent is subject to a terminal disclaimer.

(21) Appl. No.: 15/193,556

(22) Filed: Jun. 27, 2016

(65) Prior Publication Data

US 2017/0171999 A1    Jun. 15, 2017

Related U.S. Application Data

(63) Continuation of application No. 14/963,681, filed on Dec. 9, 2015, now Pat. No. 9,555,606.

(51) Int. Cl.
*H05K 5/02* (2006.01)
*B29C 65/02* (2006.01)
(Continued)

(52) U.S. Cl.
CPC .......... *H05K 5/0208* (2013.01); *B29C 65/02* (2013.01); *H05K 5/0013* (2013.01); *H05K 5/064* (2013.01); *B29L 2031/752* (2013.01)

(58) Field of Classification Search
None
See application file for complete search history.

(56) References Cited

U.S. PATENT DOCUMENTS 3,165,569 A    1/1965    Bright et al.
4,160,503 A    7/1979    Ohlbach
(Continued)

FOREIGN PATENT DOCUMENTS

CN    2014-30639 Y    3/2010
CN    10-4346587 A    2/2015
(Continued)

OTHER PUBLICATIONS

Holm, Ragnar, "Electric Contacts: Theory and Application", Spinger-Verlag, New York, 4th Edition, 1981 (pp. 10-19).
(Continued)

*Primary Examiner* — Jeffry H Aftergut
(74) *Attorney, Agent, or Firm* — Tihon Poltavets, Esq.; Kevin P. Radigan, Esq.; Heslin Rothenberg Farley & Mesiti P.C.

(57) ABSTRACT

Assembly apparatuses and processes are provided which include a pressure cure fixture. The pressure cure fixture is sized to reside within a container, such as an electronic enclosure, and facilitate applying pressure to an adhesive disposed over an inner surface of the container. The pressure cure fixture is formed of a material with a higher coefficient of thermal expansion (CTE) than the container, and is sized to correspond, at least in part, to an inner space of the container while allowing for the adhesive and a surface-mount element to be disposed between the pressure cure fixture and the inner surface of the container. When heated, the pressure cure fixture expands greater than the container and imparts the pressure to the surface-mount element and
(Continued)

the adhesive to facilitate securing the surface-mount element to the inner surface of the container.

19 Claims, 21 Drawing Sheets

(51) Int. Cl.
*H05K 5/00* (2006.01)
*H05K 5/06* (2006.01)
*B29L 31/00* (2006.01)

(56) References Cited

U.S. PATENT DOCUMENTS

| | | | |
|---|---|---|---|
| 4,211,324 A | 7/1980 | Ohlbach | |
| 4,324,823 A | 4/1982 | Ray, III | |
| 4,496,900 A | 1/1985 | Di Stefano et al. | |
| 4,516,679 A | 5/1985 | Simpson et al. | |
| 4,593,384 A | 6/1986 | Kleinjne | |
| 4,609,104 A | 9/1986 | Kasper et al. | |
| 4,653,252 A | 3/1987 | Van de Haar et al. | |
| 4,677,809 A | 7/1987 | Long et al. | |
| 4,691,350 A | 9/1987 | Kleijne et al. | |
| 4,807,284 A | 2/1989 | Kleijne | |
| 4,811,288 A | 3/1989 | Kleijne et al. | |
| 4,860,351 A | 8/1989 | Weingart | |
| 4,865,197 A | 9/1989 | Craig | |
| 5,009,311 A | 4/1991 | Schenk | |
| 5,027,397 A | 6/1991 | Double et al. | |
| 5,060,114 A | 10/1991 | Feinberg et al. | |
| 5,075,822 A | 12/1991 | Baumler et al. | |
| 5,117,457 A | 5/1992 | Comerford et al. | |
| 5,159,629 A | 10/1992 | Double et al. | |
| 5,185,717 A | 2/1993 | Mori | |
| 5,201,868 A | 4/1993 | Johnson | |
| 5,201,879 A | 4/1993 | Steele et al. | |
| 5,211,618 A | 5/1993 | Stoltz | |
| 5,239,664 A | 8/1993 | Verrier et al. | |
| 5,389,738 A | 2/1995 | Piosenka et al. | |
| 5,406,630 A | 4/1995 | Piosenka et al. | |
| 5,506,566 A | 4/1996 | Oldfield et al. | |
| 5,568,124 A | 10/1996 | Joyce et al. | |
| 5,594,439 A | 1/1997 | Swanson | |
| 5,675,319 A | 10/1997 | Rivenberg et al. | |
| 5,715,652 A | 2/1998 | Stahlecker | |
| 5,761,054 A | 6/1998 | Kuhn | |
| 5,813,113 A | 9/1998 | Stewart et al. | |
| 5,858,500 A | 1/1999 | MacPherson | |
| 5,880,523 A | 3/1999 | Candelore | |
| 5,988,510 A | 11/1999 | Tuttle et al. | |
| 6,121,544 A | 9/2000 | Petsinger | |
| 6,195,267 B1 | 2/2001 | MacDonald, Jr. et al. | |
| 6,201,296 B1 | 3/2001 | Fries et al. | |
| 6,261,215 B1 | 7/2001 | Imer | |
| 6,301,096 B1 | 10/2001 | Wozniczka | |
| 6,384,397 B1 | 5/2002 | Takiar et al. | |
| 6,424,954 B1 | 7/2002 | Leon | |
| 6,438,825 B1 | 8/2002 | Kuhm | |
| 6,469,625 B1 | 10/2002 | Tomooka | |
| 6,512,454 B2 | 1/2003 | Miglioli et al. | |
| 6,473,995 B2 | 11/2003 | Kayama | |
| 6,686,539 B2 | 2/2004 | Farquhar et al. | |
| 6,746,960 B2 | 6/2004 | Goodman et al. | |
| 6,798,660 B2 | 9/2004 | Moss et al. | |
| 6,853,093 B2 | 2/2005 | Cohen et al. | |
| 6,879,032 B2 | 4/2005 | Rosenau et al. | |
| 6,929,900 B2 | 8/2005 | Farquhar et al. | |
| 6,946,960 B2 | 9/2005 | Sisson et al. | |
| 6,957,345 B2 | 10/2005 | Cesana et al. | |
| 6,970,360 B2 | 11/2005 | Sinha | |
| 6,985,362 B2 | 1/2006 | Mori et al. | |
| 6,991,961 B2 | 1/2006 | Hubbard et al. | |
| 6,996,953 B2 | 2/2006 | Perreault et al. | |
| 7,005,733 B2 | 2/2006 | Kommerling et al. | |
| 7,015,823 B1 | 3/2006 | Gillen et al. | |
| 7,054,162 B2 | 5/2006 | Benson et al. | |
| 7,057,896 B2 | 6/2006 | Matsuo et al. | |
| 7,094,143 B2 | 8/2006 | Wolm et al. | |
| 7,094,459 B2 | 8/2006 | Takahashi | |
| 7,095,615 B2 | 8/2006 | Nichols | |
| 7,156,233 B2 | 1/2007 | Clark et al. | |
| 7,180,008 B2 | 2/2007 | Heitmann et al. | |
| 7,189,360 B1 | 3/2007 | Ho et al. | |
| 7,214,874 B2 | 5/2007 | Dangler et al. | |
| 7,247,791 B2 | 7/2007 | Kulpa | |
| 7,304,373 B2 | 12/2007 | Taggart et al. | |
| 7,310,737 B2 | 12/2007 | Patel et al. | |
| 7,465,887 B2 | 12/2008 | Suzuki et al. | |
| 7,475,474 B2 | 1/2009 | Heitmann et al. | |
| 7,515,418 B2 | 4/2009 | Straznicky et al. | |
| 7,549,064 B2 | 6/2009 | Elbert et al. | |
| 7,640,658 B1 | 1/2010 | Pham et al. | |
| 7,643,290 B1 | 1/2010 | Narasimhan et al. | |
| 7,663,883 B2 | 2/2010 | Shirakami et al. | |
| 7,672,129 B1 | 3/2010 | Ouyang et al. | |
| 7,731,517 B2 | 6/2010 | Lee et al. | |
| 7,746,657 B2 | 6/2010 | Oprea et al. | |
| 7,760,086 B2 | 7/2010 | Hunter et al. | |
| 7,768,005 B2 | 8/2010 | Condorelli et al. | |
| 7,783,994 B2 | 8/2010 | Ball et al. | |
| 7,787,256 B2 | 8/2010 | Chan et al. | |
| 7,868,411 B2 | 1/2011 | Eaton et al. | |
| 7,898,413 B2 | 3/2011 | Hsu et al. | |
| 7,901,977 B1 | 3/2011 | Angelopoulos et al. | |
| 7,947,911 B1 | 5/2011 | Pham et al. | |
| 7,978,070 B2 | 7/2011 | Hunter | |
| 8,006,101 B2 | 8/2011 | Crawford | |
| 8,084,855 B2 | 12/2011 | Lower et al. | |
| 8,094,450 B2 | 1/2012 | Cole et al. | |
| 8,133,621 B2 | 3/2012 | Wormald et al. | |
| 8,101,267 B2 | 6/2012 | Moh et al. | |
| 8,199,506 B2 | 6/2012 | Janik et al. | |
| 8,287,336 B2 | 10/2012 | Dangler et al. | |
| 8,325,486 B2 | 12/2012 | Arshad et al. | |
| 8,516,269 B1 | 8/2013 | Hamlet et al. | |
| 8,589,703 B2 | 11/2013 | Lee | |
| 8,646,108 B2 | 2/2014 | Shiakallis et al. | |
| 8,659,506 B2 | 2/2014 | Nomizo | |
| 8,659,908 B2 | 2/2014 | Adams et al. | |
| 8,664,047 B2 | 3/2014 | Lower et al. | |
| 8,716,606 B2 | 5/2014 | Kelley et al. | |
| 8,797,059 B2 | 8/2014 | Boday et al. | |
| 8,836,509 B2 | 9/2014 | Lowy | |
| 8,853,839 B2 | 10/2014 | Gao et al. | |
| 8,879,266 B2 | 11/2014 | Jarvis et al. | |
| 8,890,298 B2 | 11/2014 | Buer et al. | |
| 8,947,889 B2 | 2/2015 | Kelley et al. | |
| 8,961,280 B2 | 2/2015 | Dangler et al. | |
| 9,003,199 B2 | 4/2015 | Dellmo et al. | |
| 9,011,762 B2 | 4/2015 | Seppa et al. | |
| 9,052,070 B2 | 6/2015 | Davis et al. | |
| 9,166,586 B2 | 10/2015 | Carapelli et al. | |
| 9,298,956 B2 | 3/2016 | Wade et al. | |
| 9,555,606 B1 * | 1/2017 | Fisher | H05K 3/284 |
| 2001/0050425 A1 | 12/2001 | Beroz et al. | |
| 2001/0056542 A1 | 12/2001 | Cesana et al. | |
| 2002/0002683 A1 | 1/2002 | Benson | |
| 2002/0068384 A1 | 6/2002 | Beroz et al. | |
| 2002/0084090 A1 | 7/2002 | Farquhar | |
| 2003/0009684 A1 | 1/2003 | Schwenck et al. | |
| 2005/0068735 A1 | 3/2005 | Fissore et al. | |
| 2005/0111194 A1 | 5/2005 | Sohn et al. | |
| 2005/0180104 A1 | 8/2005 | Olesen et al. | |
| 2006/0034731 A1 | 2/2006 | Lewis et al. | |
| 2006/0049941 A1 | 3/2006 | Hunter et al. | |
| 2006/0072288 A1 | 4/2006 | Stewart et al. | |
| 2006/0196945 A1 | 9/2006 | Mendels | |
| 2006/0218779 A1 | 10/2006 | Ooba et al. | |
| 2007/0064396 A1 | 3/2007 | Oman et al. | |
| 2007/0064399 A1 | 3/2007 | Mandel et al. | |
| 2007/0108619 A1 | 5/2007 | Hsu | |
| 2007/0211436 A1 | 9/2007 | Robinson et al. | |
| 2007/0230127 A1 | 10/2007 | Peugh et al. | |
| 2007/0268671 A1 | 11/2007 | Brandenburg et al. | |

(56) References Cited

U.S. PATENT DOCUMENTS

| | | |
|---|---|---|
| 2008/0050512 A1 | 2/2008 | Lower et al. |
| 2008/0144290 A1 | 6/2008 | Brandt et al. |
| 2008/0159539 A1 | 7/2008 | Huang et al. |
| 2008/0160274 A1 | 7/2008 | Dang et al. |
| 2008/0191174 A1 | 8/2008 | Ehrensvard et al. |
| 2008/0251906 A1 | 10/2008 | Eaton et al. |
| 2009/0073659 A1 | 3/2009 | Peng et al. |
| 2009/0166065 A1 | 7/2009 | Clayton et al. |
| 2010/0088528 A1 | 4/2010 | Sion |
| 2010/0110647 A1 | 5/2010 | Hiew et al. |
| 2010/0177487 A1 | 7/2010 | Arshad et al. |
| 2010/0319986 A1 | 12/2010 | Bleau et al. |
| 2011/0001237 A1 | 1/2011 | Brun et al. |
| 2011/0038123 A1 | 2/2011 | Janik et al. |
| 2011/0103027 A1 | 5/2011 | Aoki et al. |
| 2011/0241446 A1 | 10/2011 | Tucholski |
| 2011/0299244 A1 | 12/2011 | Dede et al. |
| 2012/0050998 A1 | 3/2012 | Klum et al. |
| 2012/0117666 A1 | 5/2012 | Oggioni et al. |
| 2012/0140421 A1 | 6/2012 | Kirstine et al. |
| 2012/0319986 A1 | 6/2012 | Toh et al. |
| 2012/0170217 A1 | 7/2012 | Nishikimi et al. |
| 2012/0185636 A1 | 7/2012 | Leon et al. |
| 2013/0170217 A1 | 7/2012 | Nishikimi et al. |
| 2012/0244742 A1 | 9/2012 | Wertz et al. |
| 2012/0256305 A1 | 10/2012 | Kaufmann et al. |
| 2012/0320529 A1 | 12/2012 | Loong et al. |
| 2013/0033818 A1 | 2/2013 | Hosoda et al. |
| 2013/0058052 A1 | 3/2013 | Arshad et al. |
| 2013/0104252 A1 | 4/2013 | Yanamadala et al. |
| 2013/0141137 A1 | 6/2013 | Krutzik et al. |
| 2013/0158936 A1 | 6/2013 | Rich et al. |
| 2013/0208422 A1 | 8/2013 | Hughes et al. |
| 2013/0235527 A1 | 9/2013 | Wagner et al. |
| 2013/0283386 A1 | 10/2013 | Lee |
| 2014/0022733 A1 | 1/2014 | Lim et al. |
| 2014/0160679 A1 | 6/2014 | Kelty et al. |
| 2014/0184263 A1 | 7/2014 | Ehrenpfordt et al. |
| 2014/0204533 A1 | 7/2014 | Abeyasekera et al. |
| 2014/0321064 A1 | 10/2014 | Bose et al. |
| 2014/0325688 A1 | 10/2014 | Cashin et al. |
| 2015/0007427 A1 | 1/2015 | Dangler et al. |
| 2015/0163933 A1 | 6/2015 | Steiner |
| 2015/0235053 A1 | 8/2015 | Lee et al. |
| 2016/0005262 A1 | 1/2016 | Hirato et al. |
| 2016/0137548 A1 | 5/2016 | Cabral, Jr. et al. |
| 2016/0262253 A1 | 9/2016 | Isaacs et al. |
| 2016/0262270 A1 | 9/2016 | Isaacs et al. |
| 2017/0019987 A1 | 1/2017 | Dragone et al. |

FOREIGN PATENT DOCUMENTS

| | | |
|---|---|---|
| DE | 19816571 A1 | 10/1999 |
| DE | 19816572 A1 | 10/1999 |
| DE | 10-2012-203955 A1 | 9/2013 |
| EP | 0 056 360 A1 | 10/1993 |
| EP | 0 629 497 A2 | 12/1994 |
| EP | 1 184 773 A1 | 3/2002 |
| EP | 1 207 444 A2 | 5/2002 |
| EP | 1484163 A2 | 7/2002 |
| EP | 1 734 578 A1 | 12/2006 |
| EP | 1 968 362 A2 | 9/2008 |
| EP | 2 104 407 A1 | 9/2009 |
| EP | 1 672 464 B1 | 4/2012 |
| EP | 2 560 467 A1 | 2/2013 |
| JP | S5554649 A | 4/1980 |
| JP | 61-297035 A | 12/1986 |
| JP | S61297035 A | 12/1986 |
| JP | 2000-238141 A | 9/2000 |
| JP | 2013-125807 A | 6/2013 |
| JP | 2013-140112 A | 7/2013 |
| WO | WO 1999/003675 A1 | 1/1999 |
| WO | WO 1999/021142 A1 | 4/1999 |
| WO | WO 2001/063994 A2 | 8/2001 |
| WO | 2003/012606 A2 | 2/2003 |
| WO | WO 2003/025080 A1 | 3/2003 |
| WO | WO 2004/040505 A1 | 5/2004 |
| WO | WO 2009/042335 A1 | 4/2009 |
| WO | WO 2009/092472 A1 | 7/2009 |
| WO | WO 2010/128939 A1 | 11/2010 |
| WO | WO 2013/004292 A1 | 1/2013 |
| WO | WO 2013/0189483 A1 | 12/2013 |
| WO | WO 2014/086987 A2 | 6/2014 |
| WO | WO 2014/158159 A1 | 10/2014 |

OTHER PUBLICATIONS

Clark, Andrew J., "Physical Protection of Cryptographic Devices", Advanced in Cyprtology, Eurocrypt '87, Springer, Berlin Heidelberg (1987) (11 pages).

Halperin et al., "Latent Open Testing of Electronic Packaging", MCMC-194, IEEE (1994) (pp. 83-33).

Simek, Bob, "Tamper Restrictive Thermal Ventilation System for Enclosures Requiring Ventilation and Physical Security", IBM Publication No. IPCOM000008607D, Mar. 1, 1998 (2 pages).

Pamula et al., "Cooling of Integrated Circuits Using Droplet-Based Microfluidics", Association for Computing Machinery (ACM), GLSVLSI'03, Apr. 28-29, 2003 (pp. 84-87).

Saran et al., "Fabrication and Characterization of Thin Films of Single-Walled Carbon Nanotube Bundles on Flexible Plastic Substrates", Journal of the American Chemical Society, vol. 126, No. 14 (Mar. 23, 2004) (pp. 4462-4463).

Khanna P.K. et al., "Studies on Three-Dimensional Moulding, Bonding and Assembling of Low-Temperature-Cofired Ceramics MEMS and MST Applications." Materials Chemistry and Physics, vol. 89, No. 1 (2005) (pp. 72-79).

Drimer et al., "Thinking Inside the Box: System-Level Failures of Tamper Proofing", 2008 IEEE Symposium on Security and Privacy, (Feb. 2008) (pp. 281-295).

Loher et al., "Highly Integrated Flexible Electronic Circuits and Modules", 3rd International IEEE on Microsystems, Packaging, Assembly & Circuits Technology Conference (Oct. 22-24, 2008) (Abstract Only) (1 page).

Sample et al., "Design of an RFID-Based Battery-Free Programmable Sensing Platform", IEEE Transactions on Instrumentation and Measurement, vol. 57, No. 11, Nov. 2008 (pp. 2608-2615).

Jhang et al., "Nonlinear Ultrasonic Techniques for Non-Destructive Assessment of Micro Damage in Material: A Review", International Journal of Prec. Eng. & Manuf., vol. 10, No. 1, Jan. 2009 (pp. 123-135).

Anonymous, "Consolidated Non-Volatile Memory in a Chip Stack", IBM Technical Disclosure: IP.com No. IPCOM000185250, Jul. 16, 2009 (6 pages).

Isaacs et al., "Tamper Proof, Tamper Evident Encryption Technology", Pan Pacific Symposium SMTA Proceedings (2013) (9 pages).

Anonymous, "Selective Memory Encryption", IBM Technical Disclosure: IP.com IPCOM000244183, Nov. 20, 2015 (6 pages).

Zhou et al., "Nonlinear Analysis for Hardware Trojan Detection", ICSPCC2015, IEEE (2015) (4 pages).

Harting Mitronics, "Saftey Caps for Payment Terminals, http://harting-mitronics.ch/fileadmin/hartingmitronics/case_studies/Saftey_caps_for_payment_terminals.pdf", downloaded Aug. 2016 (2 pages).

Dangler et al., "Tamper-Respondent Sensors with Formed Flexible Layer(s)", U.S. Appl. No. 14/865,551, filed Sep. 25, 2015 (113 pages).

Brodsky et al., "Overlapping, Discrete Tamper-Respondent Sensors", U.S. Appl. No. 14/865,572, filed Sep. 25, 2015 (114 pages).

Dangler et al., "Tamper-Respondent Assemblies with Region(s) of Increased Susceptibility to Damage", U.S. Appl. No. 14/865,591, filed Sep. 25, 2015 (114 pages).

Brodsky et al., "Circuit Boards and Electronic Packages with Embedded Tamper-Respondent Sensor", U.S. Appl. No. 14/865,610, filed Sep. 25, 2015 (43 pages).

Brodsky et al, "Tamper-Respondent Assemblies", U.S. Appl. No. 14/865,632, filed Sep. 25, 2015 (115 pages).

Brodksky et al., "Enclosure with Inner Tamper-Respondent Sensor(s)", U.S. Appl. No. 14/865,651, filed Sep. 25, 2015 (115 pages).

(56) References Cited

OTHER PUBLICATIONS

Fisher et al., "Enclosure with Inner Tamper-Respondent Sensor(s) and Physical Security Element(s)", U.S. Appl. No. 14/865,686, filed Sep. 25, 2015 (114 pages).
Brodsky et al., "Tamper-Respondent Assemblies with Bond Protection", U.S. Appl. No. 14/865,708, filed Sep. 25, 2015 (113 pages).
Brodsky et al., "Circuit Layouts of Tamper-Respondent Sensors", U.S. Appl. No. 14/886,179, filed Oct. 19, 2015 (113 pages).
Isaacs, Phillip Duane, "Tamper-Respondent Assembly with Protective Wrap(s) Over Tamper-Respondent Sensor(s)", U.S. Appl. No. 14/918,691, filed Oct. 21, 2015 (40 pages).
Brodsky et al., "Tamper-Respondent Assemblies with Bond Protection", U.S. Appl. No. 14/941,860, filed Nov. 16, 2015 (108 pages).
Fisher et al., "Enclosure with Inner Tamper-Respondent Sensor(s) and Physical Security Element(s)", U.S. Appl. No. 14/941,872, filed Nov. 16, 2015 (109 pages).
Brodsky et al, "Tamper-Respondent Assemblies", U.S. Appl. No. 14/941,887, filed Nov. 16, 2015 (109 pages).
Brodsky et al., "Circuit Boards and Electronic Packages with Embedded Tamper-Respondent Sensors", U.S. Appl. No. 14/941,908, filed Nov. 16, 2015 (41 pages).
Fisher et al., "Tamper-Respondent Assembly with Vent Structure", U.S. Appl. No. 14/955,283, filed Dec. 1, 2015 (61 pages).
Fisher et al., "Applying Pressure to Adhesive Using CTE Mismatch Between Components", U.S. Appl. No. 14/963,681, filed Dec. 9, 2015 (68 pages).
Brodsky et al., "Tamper-Respondent Assemblies with Enclosure-to-Board Protection", U.S. Appl. No. 14/974,036, filed Dec. 18, 2015 (55 pages).
Busby et al., "Multi-Layer Stack with Embedded Tamper-Detect Protection", U.S. Appl. No. 15/053,336, filed Feb. 25, 2016 (68 pages).
Campbell et al., "Tamper-Proof Electronic Packages With Two-Phase Dielectric Fluid", U.S. Appl. No. 15/139,503, filed Apr. 27, 2016 (60 pages).
Busby et al., "Tamper-Proof Electronic Packages Formed With Stressed Glass", U.S. Appl. No. 15/154,077, filed May 13, 2016 (45 pages).
Busby et al., "Tamper-Proof Electronic Packages With Stressed Glass Component Substrate(s)", U.S. Appl. No. 15/154,088, filed May 13, 2016 (56 pages).
Brodsky et al., "Circuit Layouts of Tamper-Respondent Sensors", U.S. Appl. No. 15/187,002, filed Jun. 20, 2016 (110 pages).
Brodsky et al., "Tamper-Respondent Assemblies with Enclosure-to-Board Protection", U.S. Appl. No. 15/193,525, filed Jun. 27, 2016 (54 pages).
Busby et al., "Tamper-Respondent Assembly with Nonlinearity Monitoring", U.S. Appl. No. 15/194,738, filed Jun. 28, 2016 (48 pages).
Dangler et al., "Tamper-Respondent Sensors with Formed Flexible Layer(s)", U.S. Appl. No. 15/249,663, filed Aug. 29, 2016 (109 pages).
Brodsky et al., "Overlapping, Discrete Tamper-Respondent Sensors", U.S. Appl. No. 15/249,671, filed Aug. 29, 2016 (109 pages).
Dangler et al., "Tamper-Respondent Assemblies with Region(s) of Increased Susceptibility to Damage", U.S. Appl. No. 15/249,676, filed Aug. 29, 2016 (110 pages).
Dragone et al., "Tamper-Respondent Assembly with Sensor Connection Adapter", U.S. Appl. No. 15/268,959, filed Sep. 19, 2016 (45 pages).
Fisher et al., Office Action for U.S. Appl. No. 14/963,681, filed Dec. 9, 2015, dated May 6, 2016 (10 pages).
Fisher et al., Notice of Allowance for U.S. Appl. No. 14/963,681, filed Dec. 9, 2015, dated Jul. 5, 2016 (7 pages).
Fisher et al., Notice of Allowance for U.S. Appl. No. 14/963,681, filed Dec. 9, 2015, dated Sep. 20, 2016 (7 pages).
Fisher et al., "List of IBM Patents and/or Patent Applications Treated as Related", U.S. Appl. No. 15/193,556, filed Jun. 27, 2016, dated Sep. 26, 2016 (2 pages).
Fisher et al., GB Examination Report for Application No. GB1619363.3, dated Mar. 21, 2017 (5 pages).
Dragone et al., "Vented Tamper-Respondent Assemblies", U.S. Appl. No. 15/275,748, filed Sep. 26, 2016 (53 pages).
Dragone et al., "Tamper-Respondent Assemblies with In Situ Vent Structure(s)", U.S. Appl. No. 15/275,762, filed Sep. 26, 2016 (72 pages).
Busby et al., "Tamper-Respondent Assemblies with Trace Regions of Increased Susceptibility to Breaking", U.S. Appl. No. 15/341,108, filed Nov. 2, 2016 (56 pages).
Brodsky et al., "Enclosure with Inner Tamper-Respondent Sensor(s)", U.S. Appl. No. 15/409,851, filed Jan. 19, 2017 (115 pages).
Brodsky et al., "Tamper-Respondent Assemblies with Enclosure-to-Board Protection", U.S. Appl. No. 15/423,833, filed Feb. 3, 2017 (54 pages).

* cited by examiner

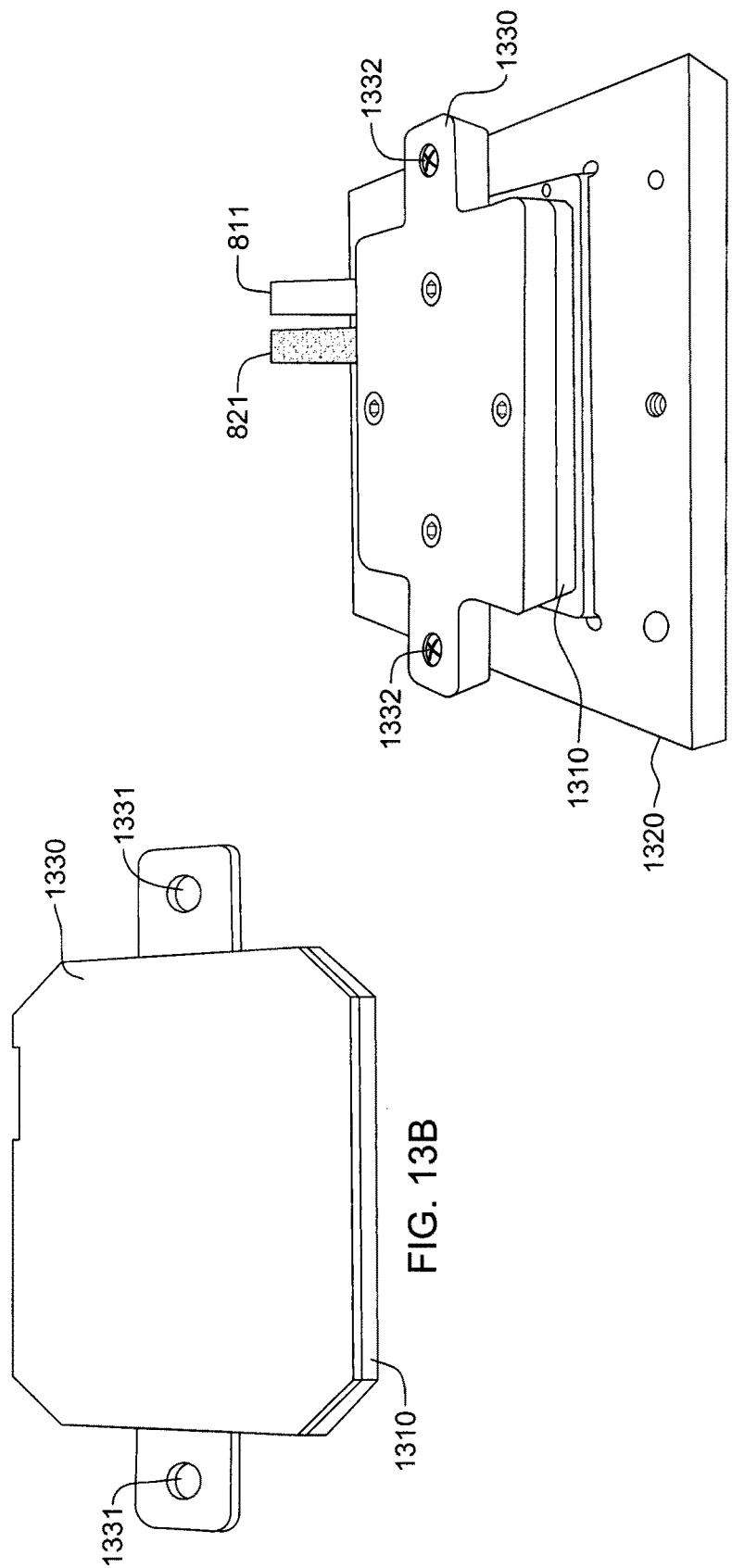

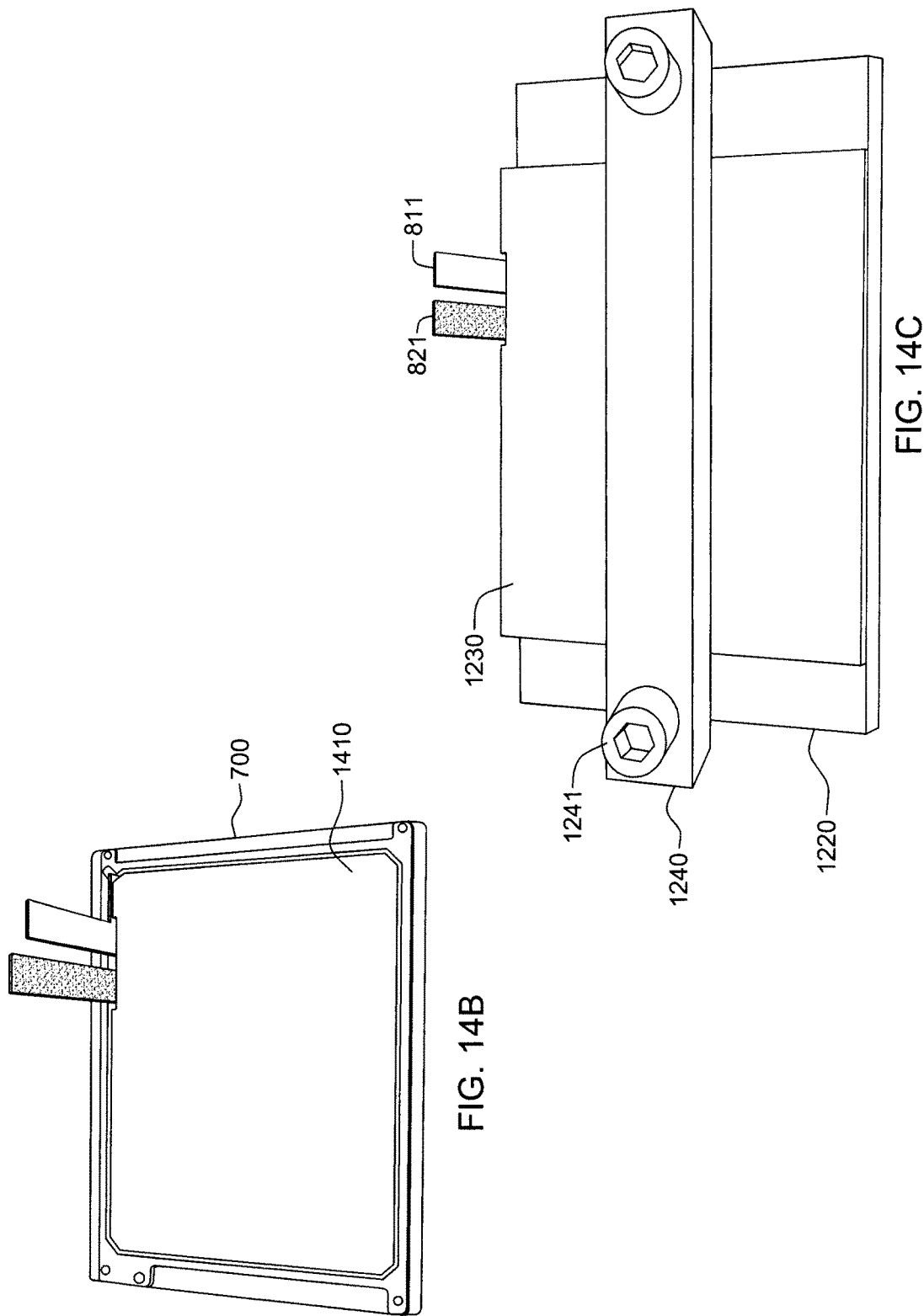

APPLYING PRESSURE TO ADHESIVE USING CTE MISMATCH BETWEEN COMPONENTS

BACKGROUND

Many activities require secure electronic communications. To facilitate secure electronic communications, an encryption/decryption system may be implemented on an electronic assembly or printed circuit board assembly that is included in equipment connected to a communications network. Such an electronic assembly is an enticing target for malefactors since it may contain codes or keys to decrypt intercepted messages, or to encode fraudulent messages. To prevent this, an electronic assembly may be mounted in an enclosure, which is then wrapped in a security sensor and encapsulated with polyurethane resin. A security sensor may be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal may be conveyed to a monitor circuit in order to reveal an attack on the integrity of the assembly. The alarm signal may also trigger an erasure of encryption/decryption keys stored within the electronic assembly.

SUMMARY

Provided herein, in one or more aspects, is an assembly apparatus comprising a pressure cure fixture. The pressure cure fixture is sized to reside within a container, and facilitate applying pressure to an adhesive disposed over an inner surface of the container. The pressure cure fixture is formed of a material with a higher coefficient of thermal expansion (CTE) than the container, and is sized to correspond, at least in part, to an inner space of the container while allowing for the adhesive and a surface-mount element to be disposed between the pressure cure fixture and the inner surface of the container. When heated, the pressure cure fixture expands greater than the container and imparts the pressure to the surface-mount element and the adhesive to facilitate securing the surface-mount element to the inner surface of the container. Within the assembly apparatus, the container is an electronic enclosure, and the surface-mount element includes a tamper-respondent sensor.

In one or more other aspects, an assembly apparatus is provided which includes a pressure cure fixture sized to reside within an electronic enclosure, and facilitate applying pressure to an adhesive disposed over an inner surface of the electronic enclosure. The pressure cure fixture is formed of a material with a higher coefficient of thermal expansion (CTE) than the electronic enclosure, and is sized to correspond, at least in part, to an inner space of the electronic enclosure while allowing for the adhesive and a tamper-respondent sensor to be disposed between the pressure cure fixture and the inner surface of the electronic enclosure. When heated, the fixture expands greater than the electronic enclosure and imparts the pressure to the tamper-respondent sensor and the adhesive to facilitate securing the tamper-respondent sensor to the inner surface of the electronic enclosure. Further, the inner surface includes an inner-sidewall of the electronic enclosure, and the tamper-respondent sensor includes an inner-sidewall tamper-respondent sensor sized to cover the inner-sidewall of the electronic enclosure, and wherein the adhesive includes an adhesive sheet layer, at least one side of the adhesive sheet layer including a pressure-sensitive adhesive.

In one or more further aspects, a fabrication method is provided which includes providing an assembly apparatus. Providing the assembly apparatus includes: providing a pressure cure fixture sized to reside within a container and facilitate applying pressure to an adhesive disposed over an inner surface of the container during curing, the pressure cure fixture being formed of a material with a higher coefficient of thermal expansion (CTE) than the container, and being sized to correspond, at least in part, to an inner space of the container while allowing for the adhesive and a surface-mount element to be disposed between the pressure cure fixture and the inner surface of the container; and wherein heating the container with the pressure cure fixture, surface-mount element and adhesive disposed therein expands the pressure cure fixture greater than the container and imparts pressure to the surface-mount element and the adhesive to facilitate securing the surface-mount element to the inner surface of the container, wherein the adhesive is a first adhesive, the pressure cure fixture is a first pressure cure fixture, the material of the first pressure cure fixture is a first material, and the surface-mount element is a first surface-mount element, and wherein the assembly apparatus further comprises a second pressure cure fixture to facilitate adhering a second surface-mount element to the inner surface of the container after the first surface-mount element has been adhered to the inner surface of the container, the second pressure cure fixture being formed of a second material with a higher coefficient of thermal expansion (CTE) than the container, the second pressure cure fixture being sized to correspond, at least in part, to the inner space of the container while allowing for the first surface-mount element, the second surface-mount element and a second adhesive to be disposed between the second pressure cure fixture and the inner surface of the container, wherein when heated, the second pressure cure fixture expands greater than the container and imparts pressure to the second surface-mount element and the second adhesive to facilitate securing the second surface-mount element to the inner surface of the container.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 13B depicts one embodiment of the pressure cure fixture and upper fixture of the assembly apparatus of FIG. 13A, in accordance with one or more aspects of the present invention;

FIG. 13C depicts the assembly apparatus of FIGS. 13A & 13B assembled to undergo heating to secure the inner main surface tamper-respondent sensor to the inner main surface of the electronic enclosure, in accordance with one or more aspects of the present invention;

FIG. 14B depicts a partial assembly of the assembly apparatus of FIG. 14A, with the pressure cure fixture and tamper-respondent sensors shown within the inner space of the electronic enclosure, in accordance with one or more aspects of the present invention; and FIG. 14C depicts the assembly apparatus of FIG. 14A assembled to undergo heating to secure the security element(s) about the inner perimeter of the electronic enclosure over, for instance, the inner-sidewall tamper-respondent sensor and inner main surface tamper-respondent sensor, in accordance with one or more aspects of the present invention.

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application, for instance, for establishing a secure volume about an electronic component or electronic assembly to be protected.

Figure 1:
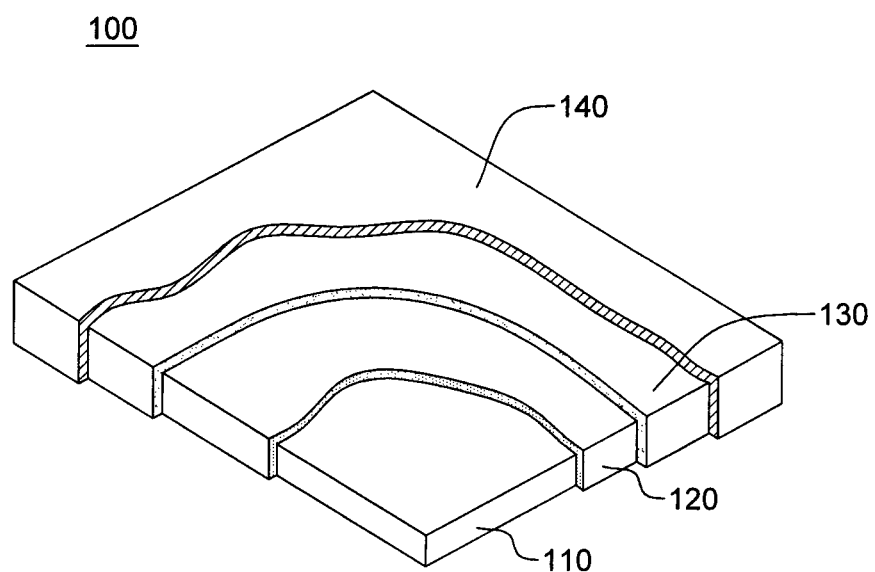
FIG. 1 is a partial cut-away of one embodiment of a tamper-proof electronic package which may incorporate a tamper-respondent electronic circuit structure, in accordance with one or more aspects of the present invention.

Reference is first made to FIG. 1 of the drawings, which illustrates one embodiment of an electronic assembly package 100 configured as a tamper-proof electronic assembly package for purposes of discussion. In the depicted embodiment, an electronic assembly enclosure 110 is provided containing, for instance, an electronic assembly, which in one embodiment may include a plurality of electronic components, such as an encryption and/or decryption module and associated memory. The encryption and/or decryption module may comprise security-sensitive information with, for instance, access to the information stored in the module requiring use of a variable key, and with the nature of the key being stored in the associated memory within the enclosure.

In one or more implementations, a tamper-proof electronic package such as depicted is configured or arranged to detect attempts to tamper-with or penetrate into electronic assembly enclosure 110. Accordingly, electronic assembly enclosure 110 also includes, for instance, a monitor circuit which, if tampering is detected, activates an erase circuit to erase information stored within the associated memory, as well as the encryption and/or decryption module within the communications card. These components may be mounted on, and interconnected by, a multilayer circuit board, such as a printed circuit board or other multilayer substrate, and be internally or externally powered via a power supply provided within the electronic assembly enclosure.

In the embodiment illustrated, and as one example only, electronic assembly enclosure 110 may be surrounded by a tamper-respondent sensor 120, an encapsulant 130, and an outer, thermally conductive enclosure 140. In one or more implementations, tamper-respondent sensor 120 may include a tamper-respondent laminate that is folded around electronic assembly enclosure 110, and encapsulant 130 may be provided in the form of a molding. Tamper-respondent sensor 120 may include various detection layers, which are monitored through, for instance, a ribbon cable by the enclosure monitor, against sudden violent attempts to penetrate enclosure 110 and damage the enclosure monitor or erase circuit, before information can be erased from the encryption module. The tamper-respondent sensor may be, for example, any such article commercially available or described in various publications and issued patents, or any enhanced article such as disclosed herein.

By way of example, tamper-respondent sensor 120 may be formed as a tamper-respondent laminate comprising a number of separate layers with, for instance, an outermost lamination-respondent layer including a matrix of, for example, diagonally-extending or sinusoidally-extending, conductive or semi-conductive lines printed onto a regular, thin insulating film. The matrix of lines forms a number of continuous conductors which would be broken if attempts are made to penetrate the film. The lines may be formed, for instance, by printing carbon-loaded Polymer Thick Film (PTF) ink onto the film and selectively connecting the lines on each side, by conductive vias, near the edges of the film. Connections between the lines and an enclosure monitor of the communications card may be provided via, for instance, one or more ribbon cables. The ribbon cable itself may be formed of lines of conductive ink printed onto an extension of the film, if desired. Connections between the matrix and the ribbon cable may be made via connectors formed on one edge of the film. As noted, the laminate may be wrapped around the electronic assembly enclosure to define the tamper-respondent sensor 120 surrounding enclosure 110.

In one or more implementations, the various elements of the laminate may be adhered together and wrapped around enclosure 110, in a similar manner to gift-wrapping a parcel, to define the tamper-respondent sensor shape 120. The assembly may be placed in a mold which is then filled with, for instance, cold-pour polyurethane, and the polyurethane may be cured and hardened to form an encapsulant 130. The encapsulant may, in one or more embodiments, completely surround the tamper-respondent sensor 120 and enclosure 110, and thus form a complete environmental seal, protecting the interior of the enclosure. The hardened polyurethane is resilient and increases robustness of the electronic package in normal use. Outer, thermally conductive enclosure 140 may optionally be provided over encapsulant 130 to, for instance, provide further structural rigidity to the electronic package.

Note that, as an enhancement, within a sealed electronic package, such as the tamper-proof electronic package depicted in FIG. 1 and described above, structures and methods for facilitating heat transfer from one or more electronic components disposed therein outwards through the enclosure and any other layers of the electronic package may be provided.

Figure 2:
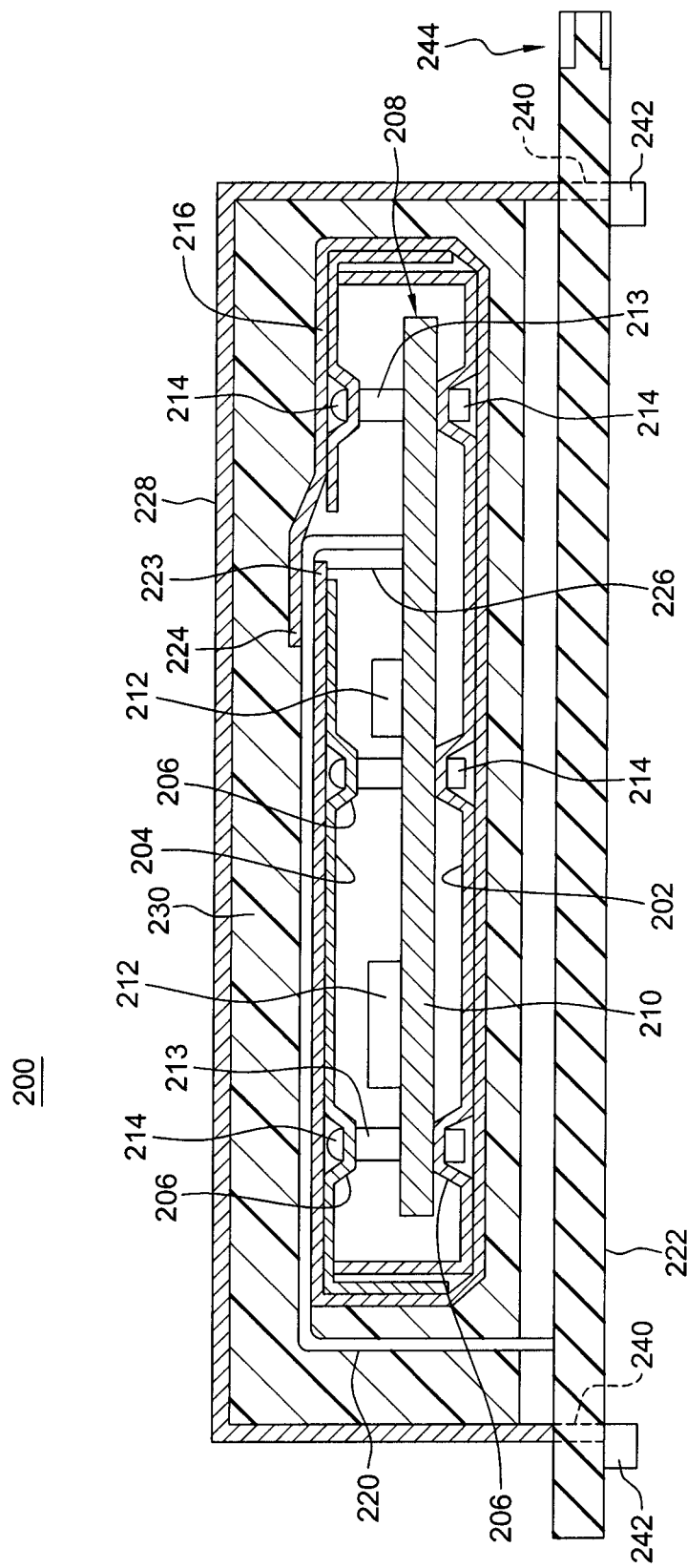
FIG. 2 is a cross-sectional elevational view of one embodiment of a prior art, tamper-proof electronic package comprising an electronic circuit.

FIG. 2 depicts in detail one embodiment of a typical tamper-proof electronic package 200. Electronic package 200 is defined by, for instance, a base metal shell 202 and a top metal shell 204. Outer surfaces of base metal shell 202 and top metal shell 204 may be provided with standoffs 206, with an electronic assembly 208 resting on standoffs 206 defined in base metal shell 202. Electronic assembly 208 may include, for instance, a printed circuit board 210 with electronic components 212 that are electrically connected via conductors (not shown) defined within or on printed circuit board 210.

Hollow spacers 213 may be placed below dimples 206 in top metal shell 204, and rivets 214 provided, extending through openings in dimples 206, through hollow spacers 213 and through openings in printed circuit board 210 to base metal shell 202 in order to fixedly secure electronic assembly 208 within the enclosure formed by base and top metal shells 202, 204. A security mesh or tamper-respondent sensor 216 is wrapped around the top, base, and four sides of the enclosure formed by base and top metal shells 202, 204. As illustrated, in one or more embodiments, top metal shell 204 may have an opening through which a bus 220 extends. One end of bus 220 may be connected to conductors (not shown) on printed circuit board 210, and the other end may be connected to conductors (not shown) on a printed circuit board 222. As bus 220 passes through the opening, the bus extends between an inner edge region 223 of the security mesh 216 and an overlapping, outer edge region 224 of the security mesh 216. A group of wires 226 connect, in one embodiment, security mesh 216 to conductors on printed circuit board 210. Circuitry on printed circuit board 210 is responsive to a break or discontinuity in security sensor array 216, in which case, an alarm signal may be emitted on bus 220, and also encryption/decryption keys stored within electronic assembly 208 may be erased.

In one or more implementations, liquid polyurethane resin may be applied to security mesh 216 and cured. An outer, thermally conductive enclosure 228, such as a copper enclosure, may be filled with liquid polyurethane resin with the electronic assembly and inner enclosure and security mesh suspended within it. Upon curing the resin, the electronic assembly and inner enclosure and security mesh become embedded in a polyurethane block or encapsulant 230, as shown. The enclosure 228 is mounted on the printed circuit board 222, which can be accomplished using, for instance, legs 240 which extend through slots in printed circuit board 222 and terminate in flanges 242, which are then bent out of alignment with the slots. Bus 220 may be connected, by way of printed circuit board 222 to connectors 244 located along, for instance, one edge of printed circuit board 222.

When considering tamper-proof packaging, the electronic package needs to maintain defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs). Security Level 4 cryptographic modules are useful for operation in physically unprotected environments. Security Level 4 also protects a cryptographic module against a security compromise due to environmental conditions or fluctuations outside of the module's normal operating ranges for voltages and temperature. Intentional excursions beyond the normal operating ranges may be used by an attacker to thwart the cryptographic module's defenses. The cryptographic module is required to either include specialized environmental protection features designed to detect fluctuations and zeroize critical security parameters, or to undergo rigorous environmental failure testing to provide reasonable assurance that the module will not be affected by fluctuations outside of the normal operating range in a manner that can compromise the security of the module.

To address the demands of ever-improving anti-intrusion technology, and the higher-performance encryption/decryption functions being provided, enhancements to the tamper-proof, tamper-evident packaging for the electronic assembly at issue are desired. Numerous enhancements are described hereinbelow to, for instance, tamper-respondent assemblies and tamper-respondent sensors. Note that the numerous inventive aspects described herein may be used singly, or in any desired combination. Additionally, in one or more implementations, the enhancements to tamper-proof electronic packaging described herein may be provided to work within defined space limitations for existing packages. For instance, one or more of the concepts described may be configured to work with peripheral component interconnect express (PCIe) size limits, and the limitations resulting from being capsulated in, for instance, an insulating encapsulant.

Thus, disclosed hereinbelow with reference to FIGS. 3-14C are various approaches and/or enhancements to creating, for instance, a secure volume for accommodating one or more electronic components, such as one or more encryption and/or decryption modules and associated components of a communications card or other electronic assembly.

Figure 3:
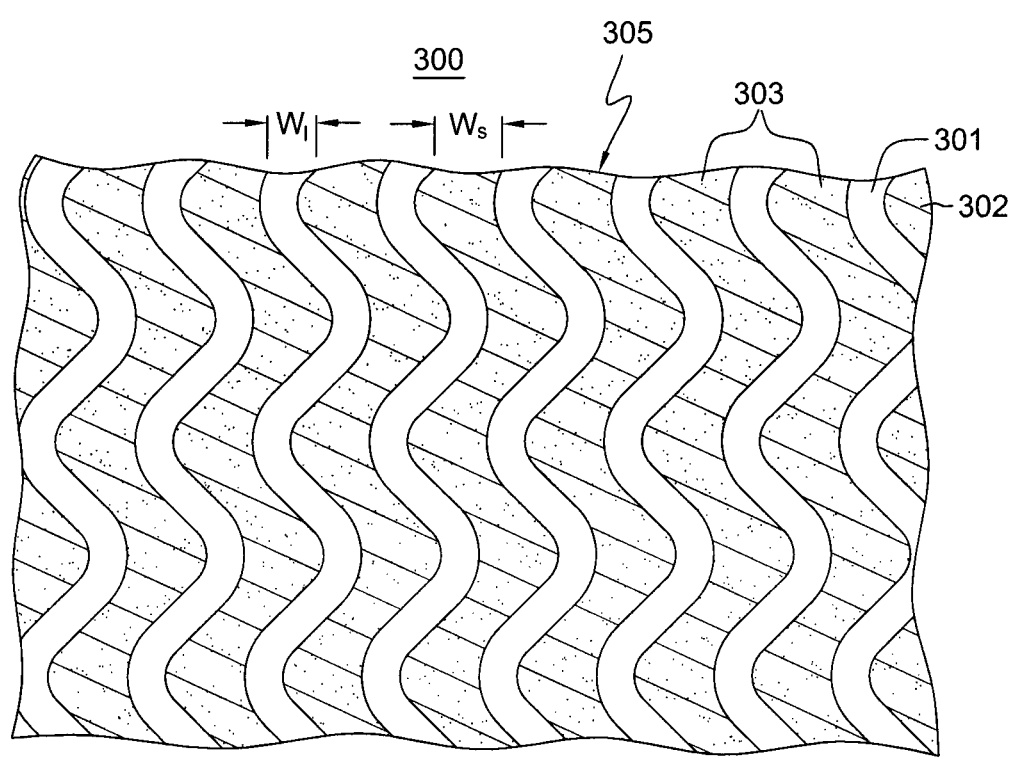
FIG. 3 depicts one embodiment of a tamper-respondent sensor comprising one or more flexible layers and circuit lines forming at least one tamper-detect network, in accordance with one or more aspects of the present invention.

FIG. 3 depicts a portion of one embodiment of a tamper-respondent layer 305 (or laser and pierce-respondent layer) of a tamper-respondent sensor 300 or security sensor, such as discussed herein. In FIG. 3, the tamper-respondent layer 305 includes circuit lines or traces 301 provided on one or both opposite sides of a flexible layer 302, which in one or more embodiments, may be a flexible insulating layer or film. FIG. 3 illustrates circuit lines 301 on, for instance, one side of flexible layer 302, with the traces on the opposite side of the film being, for instance, the same pattern, but (in one or more embodiments) offset to lie directly below spaces 303, between circuit lines 301. As described below, the circuit lines on one side of the flexible layer may be of a line width $W_1$ and have a pitch or line-to-line spacing $W_s$ such that piercing of the layer 305 at any point results in damage to at least one of the circuit lines traces 301. In one or more implementations, the circuit lines may be electrically connected in-series or parallel to define one or more conductors which may be electrically connected in a network to an enclosure monitor, which monitors the resistance of the lines, as described herein. Detection of an increase, or other change, in resistance, caused by cutting or damaging one of the traces, will cause information within the encryption and/or decryption module to be erased. Providing conductive lines 301 in a pattern, such as a sinusoidal pattern, may advantageously make it more difficult to breach tamper-respondent layer 305 without detection. Note, in this regard, that conductive lines 301 could be provided in any desired pattern. For instance, in an alternate implementation, conductive lines 301 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-respondent sensor 300 of FIG. 3 may be disposed over an outer surface of an electronic enclosure, such as an electronic enclosure described above in connection with FIGS. 1 & 2. Alternatively, as described further herein, the tamper-respondent sensor may cover or line an inner surface of an electronic enclosure to provide a secure volume about at least one electronic component to be protected. Numerous enhancements to the tamper-respondent sensor itself are described below.

In one or more aspects, disclosed herein is a tamper-respondent sensor 300 with circuit lines 301 having reduced line widths $W_1$ of, for instance, 200 μm, or less, such as less than or equal to 100 μm, or even more particularly, in the range of 30-70 μm. This is contrasted with conventional trace widths, which are typically on the order of 350 μm or larger. Commensurate with reducing the circuit line width $W_1$, line-to-line spacing width $W_s$ 303 is also reduced to less than or equal to 200 μm, such as less than or equal to 100 μm, or for instance, in a range of 30-70 μm. Advantageously, by reducing the line width $W_1$ and line-to-line spacing $W_s$ of circuit lines 301 within tamper-respondent sensor 300, the circuit line width and pitch is on the same order of magnitude as the smallest intrusion instruments currently available, and therefore, any intrusion attempt will necessarily remove a sufficient amount of a circuit line(s) to cause resistance to change, and thereby the tamper intrusion to be detected. Note that, by making the circuit line width of the smaller dimensions disclosed herein, any cutting or damage to the smaller-dimensioned circuit line will also be more likely to be detected, that is, due to a greater change in resistance. For instance, if an intrusion attempt cuts a 100 μm width line, it is more likely to reduce the line width sufficiently to detect the intrusion by a change in resistance. A change in a narrower line width is more likely to result in a detectable change in resistance, compared with, for instance, a 50% reduction in a more conventional line width of 350 µm to, for instance, 175 µm. The smaller the conductive circuit line width becomes, the more likely that a tampering of that line will be detected.

Note also that a variety of materials may advantageously be employed to form the circuit lines. For instance, the circuit lines may be formed of a conductive ink (such as a carbon-loaded conductive ink) printed onto one or both opposite sides of one or more of the flexible layers 302 in a stack of such layers. Alternatively, a metal or metal alloy could be used to form the circuit lines, such as copper, silver, intrinsically conductive polymers, carbon ink, or nickel-phosphorus (NiP), or Omega-Ply®, offered by Omega Technologies, Inc. of Culver City, Calif. (USA), or Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, may be employed. By way of further example, if conductive ink is employed as the circuit line material, fine circuit lines on the order disclosed herein can be achieved by focusing on the rheological properties of the conductive ink formulation. Further, rather than simple pneumatics of pushing conductive ink through an aperture in a stencil with a squeegee, the screen emulsion may be characterized as very thin (for instance, 150 to 200 µm), and a squeegee angle may be used such that the ink is sheared to achieve conductive ink breakaway rather than pumping the conductive ink through the screen apertures. Note that the screen for fine line width printing such as described herein may have the following characteristics in one specific embodiment: a fine polyester thread for both warp and weave on the order of 75 micrometers; a thread count between 250-320 threads per inch; a mesh thickness of, for instance, 150 micrometers; an open area between threads that is at least 1.5× to 2.0× the conductive ink particle size; and to maintain dimensional stability of the print, the screen snap-off is kept to a minimum due the screen strain during squeegee passage.

In one or more implementations, circuit lines 301 of tamper-respondent sensor 300 are electrically connected to define one or more resistive networks. Further, the circuit lines may include one or more resistive circuit lines by selecting the line material, line width $W_1$ and line length $L_1$, to provide a desired resistance per line. As one example, a "resistive circuit line" as used herein may comprise a line with 1000 ohms resistance or greater, end-to-end. In one specific example, a circuit line width of 50 µm, with a circuit line thickness of 10 µm may be used, with the line length $L_1$ and material selected to achieve the desired resistance. At the dimensions described, good electrical conductors such as copper or silver may also be employed and still form a resistive network due to the fine dimensions noted. Alternatively, materials such as conductive ink or the above-noted OmegaPly® or Ticer™ may be used to define resistive circuit lines.

In a further aspect, the flexible layer 302 itself may be further reduced in thickness from a typical polyester layer by selecting a crystalline polymer to form the flexible layer or substrate. By way of example, the crystalline polymer could comprise polyvinylidene difluoride (PVDF), or Kapton, or other crystalline polymer material. Advantageously, use of a crystalline polymer as the substrate film may reduce thickness of the flexible layer 302 to, for instance, 2 mils thick from a more conventional amorphous polyester layer of, for instance, 5-6 mils. A crystalline polymer can be made much thinner, while still maintaining structural integrity of the flexible substrate, which advantageously allows for far more folding, and greater reliability of the sensor after folding. Note that the radius of any fold or curvature of the sensor is necessarily constrained by the thickness of the layers comprising the sensor. Thus, by reducing the flexible layer thickness to, for instance, 2 mils, then in a four tamper-respondent layer stack, the stack thickness can be reduced from, for instance, 20 mils in the case of a typical polyester film, to 10 mils or less with the use of crystalline polymer films.

Figure 4A:
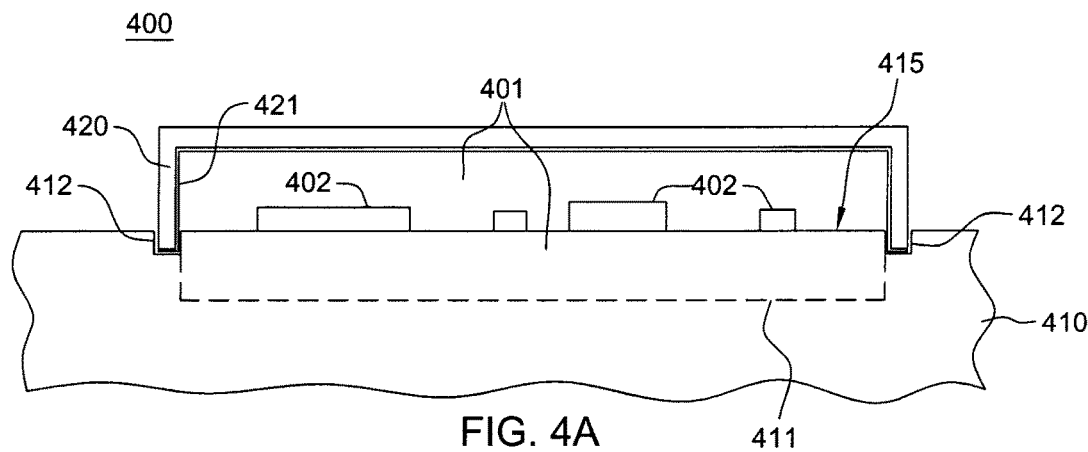
FIG. 4A is a cross-sectional elevational view of one embodiment of a tamper-respondent assembly, or tamper-proof electronic package, which includes (in part) a tamper-respondent sensor embedded within a multilayer circuit board, in accordance with one or more aspects of the present invention.
Figure 4B:
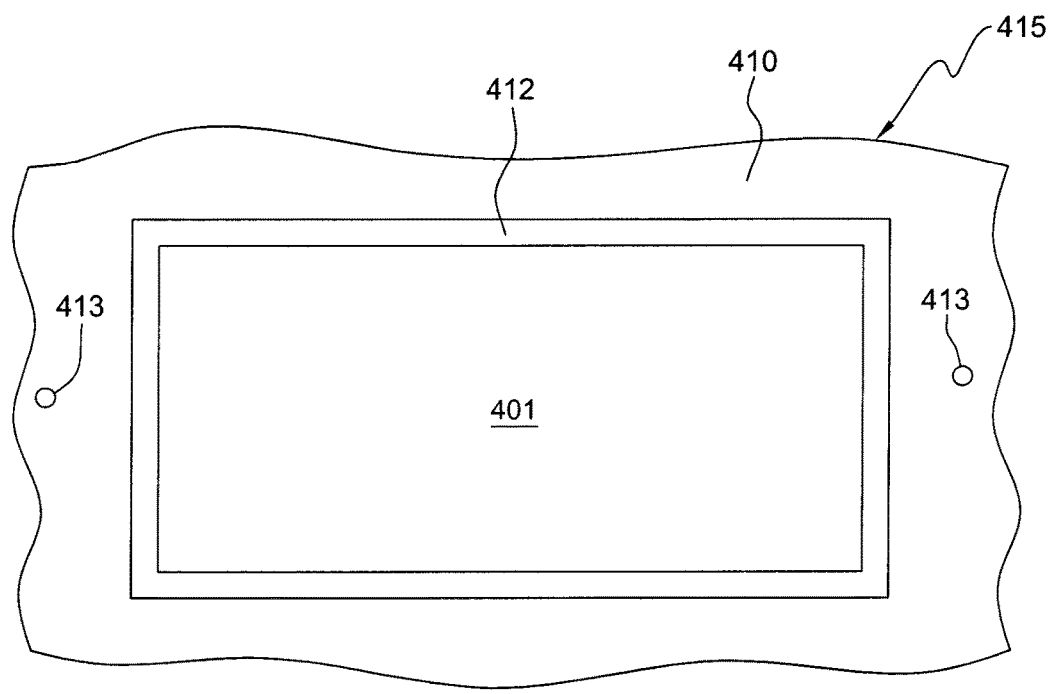
FIG. 4B is a top plan view of the multilayer circuit board of FIG. 4A, depicting one embodiment of the secure volume where defined, in part, within the multilayer circuit board, in accordance with one or more aspects of the present invention.

By way of further example, FIGS. 4A & 4B depict one embodiment of tamper-respondent assembly 400, or tamper-proof electronic package, which comprises an electronic circuit 415 to be protected, in accordance with one or more further aspects of the present invention.

Referring collectively to FIGS. 4A & 4B, electronic circuit 415 includes a multilayer circuit board 410 which has an embedded tamper-respondent sensor 411 therein that facilitates defining, in part, a secure volume 401 associated with multilayer circuit board 410 that extends into multilayer circuit board 410. In particular, in the embodiment of FIGS. 4A & 4B, secure volume 401 exists partially within multilayer circuit board 410, and partially above multilayer circuit board 410. One or more electronic components 402 are mounted to multilayer circuit board 410 within secure volume 401 and may comprise, for instance, one or more encryption modules and/or decryption modules, and associated components, with the tamper-proof electronic package comprising, in one or more embodiments, a communications card of a computer system.

Tamper-proof electronic package 400 further includes an enclosure 420, such as a pedestal-type enclosure, mounted to multilayer circuit board 410 within, for instance, a continuous groove (or trench) 412 formed within an upper surface of multilayer circuit board 410. In one or more embodiments, enclosure 420 may comprise a thermally conductive material and operate as a heatsink for facilitating cooling of the one or more electronic components 402 within the secure volume. A security mesh or tamper-respondent sensor 421, such as the above-described tamper-respondent sensors of FIG. 3, may be associated with enclosure 420, for example, wrapping around the inner surface of enclosure 420 to facilitate defining, in combination with tamper-respondent sensor 411 embedded within multilayer circuit board 410, secure volume 401. In one or more implementations, tamper-respondent sensor 421 extends down into continuous groove 412 in multilayer circuit board 410 and may, for instance, even wrap partially or fully around the lower edge of enclosure 420 within continuous groove 412 to provide enhanced tamper-detection where enclosure 420 couples to multilayer circuit board 410. In one or more implementations, enclosure 420 may be securely affixed to multilayer circuit board 410 using, for instance, a bonding material such as an epoxy or other adhesive.

As depicted in FIG. 4B, one or more external circuit connection vias 413 may be provided within multilayer circuit board 410 for electrically connecting to the one or more electronic components 402 (FIG. 4A) within secure volume 401. These one or more external circuit connection vias 413 may electrically connect to one or more external signal lines or planes (not shown) embedded within multilayer circuit board 410 and extending, for instance, into a secure base region of (or below) secure volume 401, as explained further below. Electrical connections to and from secure volume 401 may be provided by coupling to such external signal lines or planes within the multilayer circuit board 410.

As noted with reference to FIGS. 4A & 4B, secure volume 401 defined in association with multilayer circuit board 410 may be sized to house electronic components 402 to be protected, and be constructed to extend into multilayer circuit board 410. In one or more implementations, multilayer circuit board 410 includes electrical interconnect within the secure volume 401 defined in the board, for instance, for electrically connecting the multiple tamper-respondent layers of the embedded tamper-respondent sensor 411 to associated monitor circuitry also disposed within secure volume 401, along with, for instance, one or more daughter cards, such as memory DIMMs, PCIe cards, processor cards, etc.

Note that the embodiment depicted in FIGS. 4A & 4B is presented by way of example only. In one or more other implementations, the electronic circuit may comprise multiple multilayer circuit boards, each with a tamper-respondent sensor embedded within the multilayer circuit board with an appropriate connector, located within a secure volume defined between two adjacent multilayer circuit boards, interconnecting selected wiring of the multilayer circuit boards. In such an implementation, the overlying multilayer circuit board could be hollowed out to accommodate, for instance, the connector and/or one or more other electronic components between the multilayer circuit boards. In addition, other configurations of enclosure 420, and/or other approaches to coupling enclosure 420 and multilayer circuit board 410 may be employed.

Figure 5:
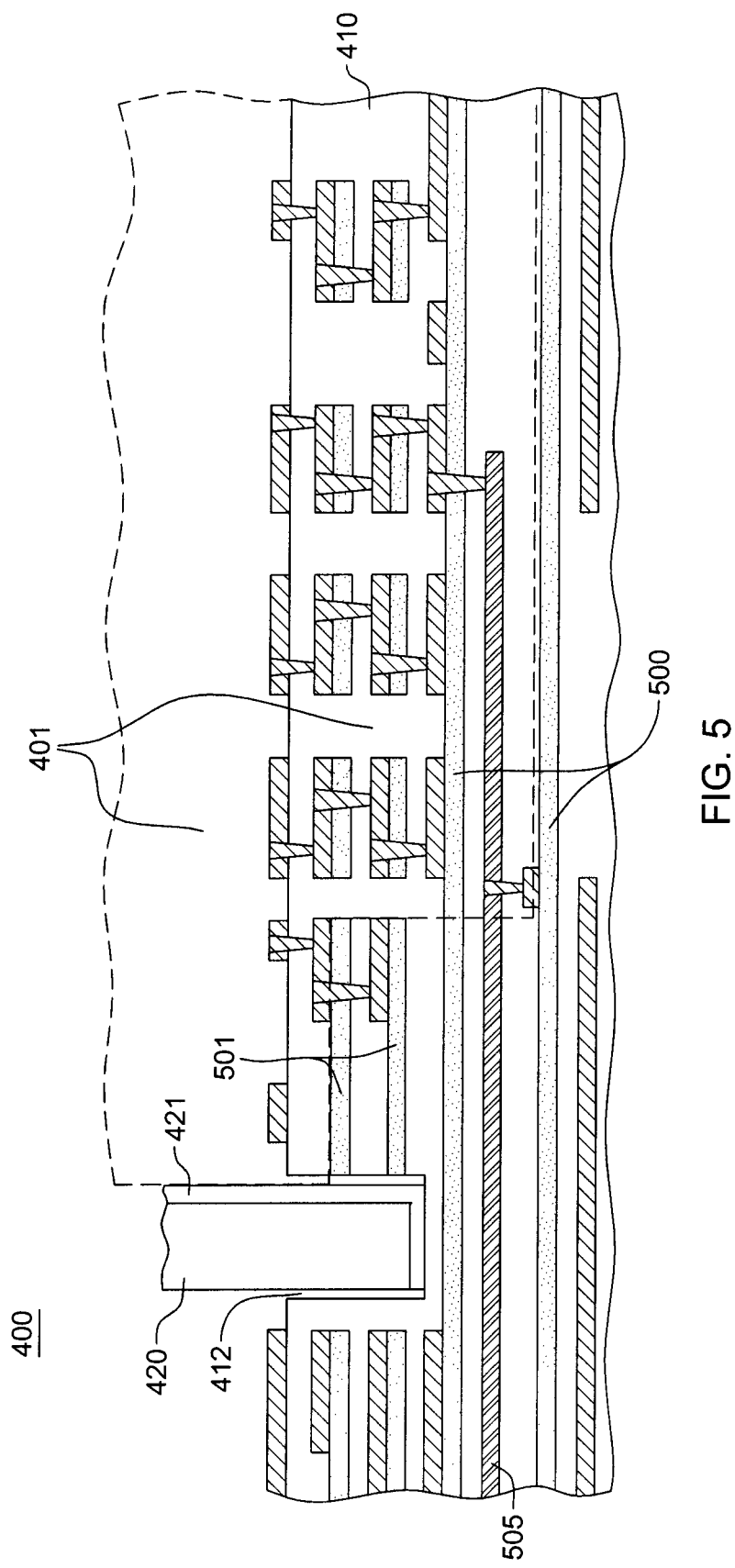
FIG. 5 is a partial cross-sectional elevational view of a tamper-respondent assembly comprising (in part) a multilayer circuit board and embedded tamper-respondent sensor, in accordance with one or more aspects of the present invention.

By way of further example, FIG. 5 depicts a partial cross-sectional elevational view of one embodiment of multilayer circuit board 410 and enclosure 420. In this configuration, the embedded tamper-respondent sensor includes multiple tamper-respondent layers including, by way of example, at least one tamper-respondent mat (or base) layer 500, and at least one tamper-respondent frame 501. In the example depicted, two tamper-respondent mat layers 500 and two tamper-respondent frame 501 are illustrated, by way of example only. The lower-most tamper-respondent mat layer 500 may be a continuous sense or detect layer extending completely below the secure volume being defined within multilayer circuit board 510. One or both tamper-respondent mat layers 500 below secure volume 401 may be partitioned into multiple circuit zones, as discussed further below. Within each tamper-respondent mat layer, or more particularly, within each circuit zone of each tamper-respondent mat layer, multiple circuits or conductive traces are provided in any desired configuration, such as the configuration described above in connection with FIG. 3. Further, the conductive traces within the tamper-respondent layers may be implemented as, for instance, a resistive layer which is difficult to attach shunt circuits to, as explained further below.

As illustrated, one or more external signal lines or planes 505 enter secure volume 401 between, in this embodiment, two tamper-respondent mat layers 500, and then electrically connect upwards into the secure volume 401 through one or more conductive vias, arranged in any desired location and pattern. In the configuration depicted, the one or more tamper-respondent frames 501 are disposed at least inside of the area defined by continuous groove 512 accommodating the base of enclosure 520. Together with security sensor 421 associated with enclosure 420, tamper-respondent frames 501 define secure volume 401 where extending, in part, into multilayer circuit board 410. With secure volume 401 defined, at least in part, within multilayer circuit board 410, the external signal line(s) 505 may be securely electrically connected to, for instance, the one or more electronic components 402 (FIG. 4A) mounted to multilayer circuit board 410 within secure volume 401. In addition, the secure volume 401 may accommodate electrical interconnection of the conductive traces of the multiple tamper-respondent layers, for instance, via appropriate monitor circuitry.

Added security may be provided by extending tamper-respondent mat layers 500 (and if desired, tamper-respondent frames 501) outward past continuous groove 412 accommodating enclosure 420. In this manner, a line of attack may be made more difficult at the interface between enclosure 420 and multilayer circuit board 410 since the attack would need to clear tamper-respondent mat layers 500, the bottom edge of tamper-respondent sensor 421 associated with enclosure 420, as well as the tamper-respondent frames 501 of the embedded tamper-respondent sensor.

Variations on the multilayer circuit board 410 of FIG. 4A are possible. For instance, in one embodiment, the embedded tamper-respondent sensor may include multiple tamper-respondent mat layers 500 and multiple tamper-respondent frames 501, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, would be facilitated.

Note also that, once within the secure volume is defined within multilayer circuit board 410, conductive vias within the secure volume between layers of multilayer circuit board 410 may be either aligned, or offset, as desired, dependent upon the implementation. Alignment of conductive vias may facilitate, for instance, providing a shortest connection path, while offsetting conductive vias between layers may further enhance security of the tamper-proof electronic package by making an attack into the secure volume through or around one or more tamper-respondent layers of the multiple tamper-respondent layers more difficult.

The tamper-respondent layers of the embedded tamper-respondent sensor formed within the multilayer circuit board of the electronic circuit or electronic package may include multiple conductive traces or lines formed between, for instance, respective sets of input and output contacts or vias at the trace termination points. Any number of conductive traces or circuits may be employed in defining a tamper-respondent layer or a tamper-respondent circuit zone within a tamper-respondent layer. For instance, 4, 6, 8, etc., conductive traces may be formed in parallel (or otherwise) within a given tamper-respondent layer or circuit zone between the respective sets of input and output contacts to those conductive traces.

Figure 6:
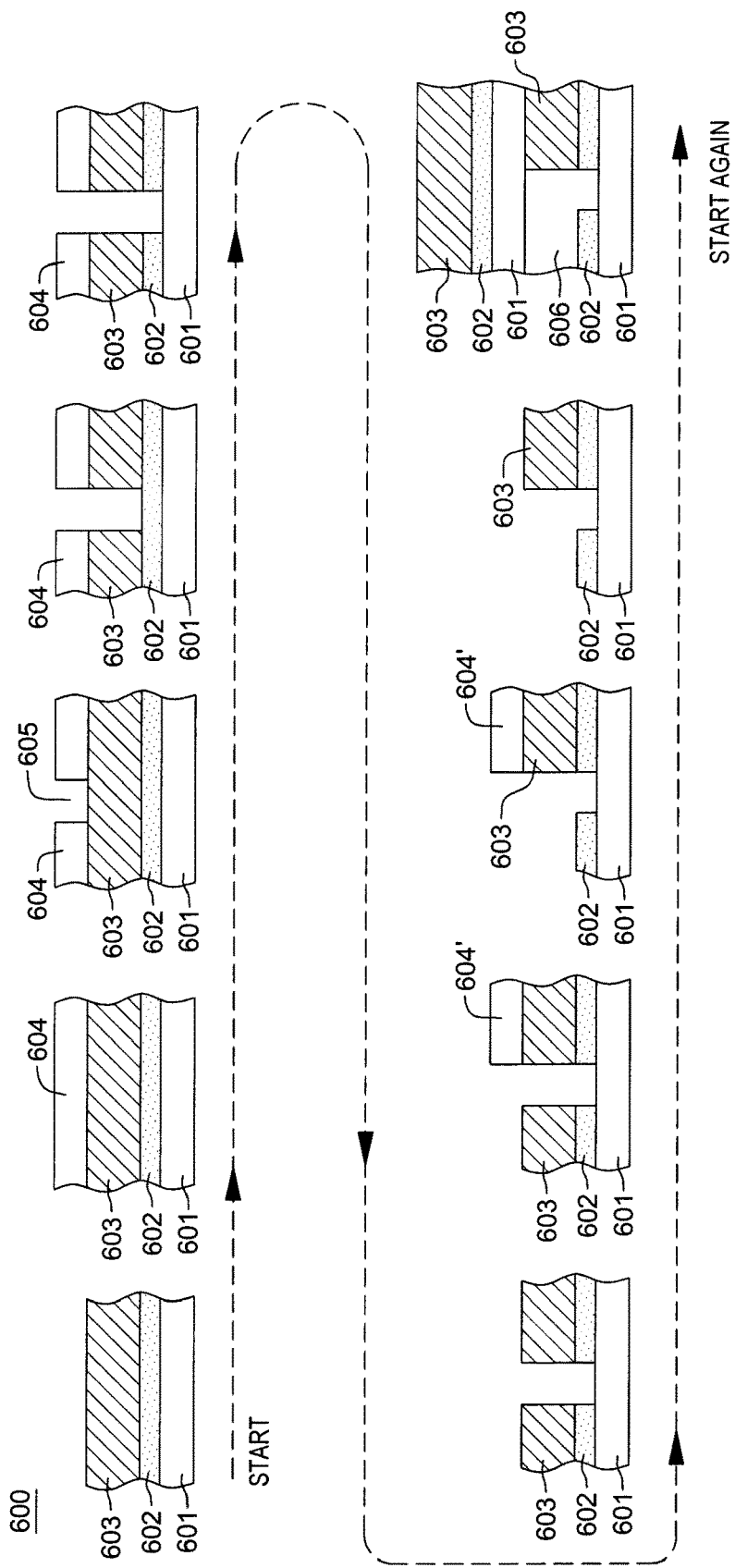
FIG. 6 depicts one embodiment of a process of fabricating a multilayer circuit board with an embedded tamper-respondent sensor, in accordance with one or more aspects of the present invention.

In one or more implementations, the multilayer circuit board may be a multilayer wiring board or printed circuit board formed, for instance, by building up the multiple layers of the board. FIG. 6 illustrates one embodiment for forming and patterning a tamper-respondent layer within such a multilayer circuit board.

As illustrated in FIG. 6, in one or more implementations, a tamper-respondent layer, such as a tamper-respondent mat layer or a tamper-respondent frame disclosed herein, may be formed by providing a material stack comprising, at least in part, a structural layer 601, such as a pre-preg (or pre-impregnated) material layer, a trace material layer 602 for use in defining the desired trace patterns, and an overlying conductive material layer 603, to be patterned to define conductive contacts or vias electrically connecting to the pattern of traces being formed within the trace material layer 602, for instance, at trace terminal points. In one or more implementations, the trace material layer 602 may comprise nickel phosphorous (NiP), and the overlying conductive layer 603 may comprise copper. Note that these materials are identified by way of example only, and that other trace and/or conductive materials may be used within the build-up 600.

A first photoresist 604 is provided over build-up 600, and patterned with one or more openings 605, through which the overlying conductive layer 603 may be etched. Depending on the materials employed, and the etch processes used, a second etch process may be desired to remove portions of trace material layer 602 to define the conductive traces of the subject tamper-respondent layer. First photoresist 604 may then be removed, and a second photoresist 604' is provided over the conductive layer 603 features to remain, such as the input and output contacts. Exposed portions of conductive layer 603 are then etched, and the second photoresist 604' may be removed, with any opening in the layer being filled, for instance, with an adhesive (or pre-preg) and a next build-up layer is provided, as shown. Note that in this implementation, most of overlying conductive layer 603 is etched away, with only the conductive contacts or vias remaining where desired, for instance, at the terminal points of the traces formed within the layer by the patterning of the trace material layer 602. Note that any of a variety of materials may be employed to form the conductive lines or traces within a tamper-respondent layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which could be employed include OhmegaPly®, offered by Ohmega Technologies, Inc., of Culver City, Calif. (USA), or Ticer™, offered by Ticer Technologies of Chandler, Ariz. (USA).

The trace lines or circuits within all of the tamper-respondent layers, and in particular, the tamper-respondent circuit zones, of the embedded tamper-respondent sensor, along with the tamper-respondent sensor 421 (FIG. 4A), may be electrically connected into monitor or compare circuitry provided, for instance, within secure volume 401 (FIG. 4A) of multilayer circuit board 410. The monitor circuitry may include various bridge or compare circuits, and conventional printed wiring board electrical interconnect inside the secure volume 401, for instance, located within the secure volume defined by the tamper-respondent frames 501 (FIG. 5), and the tamper-respondent mat layers.

Note that advantageously, different tamper-respondent circuit zones on different tamper-respondent layers may be electrically interconnected into, for instance, the same comparator circuit, Wheatstone bridge, or similar monitor circuitry. Thus, any of a large number of interconnect configurations may be possible. For instance, if each of two tamper-respondent mat layers contains 30 tamper-respondent circuit zones, and each of two tamper-respondent frames contains 4 tamper-respondent circuit zones, then, for instance, the resultant 68 tamper-respondent circuit zones may be connected in any configuration within the secure volume to create the desired arrangement of circuit networks within the secure volume being monitored for changes in resistance or tampering. Note in this regard, that the power supply or battery for the tamper-respondent sensor may be located external to the secure volume, with the sensor being configured to trip and destroy any protected or critical data if the power supply or battery is tampered with.

Figure 7:
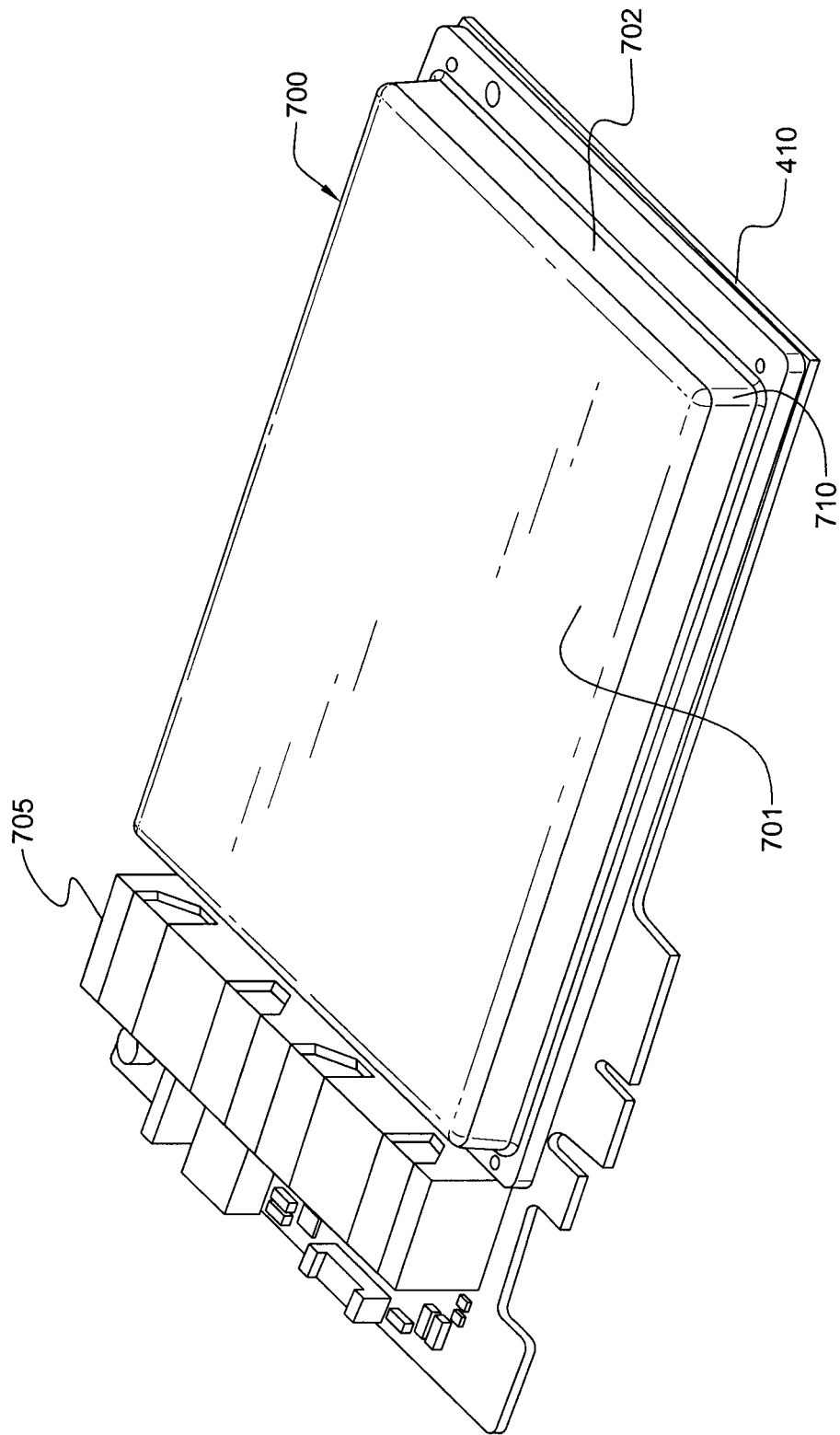
FIG. 7 is isometric view of one embodiment of a tamper-respondent assembly, or tamper-proof electronic package, which includes (in part) a multilayer circuit board with embedded tamper-respondent sensor, in accordance with one or more aspects of the present invention.

By way of example, an isometric view of one embodiment of a tamper-respondent assembly, or tamper-proof electronic package, is depicted in FIG. 7, wherein an electronic enclosure 700 is shown sealed to multilayer circuit board 410 to define a secure volume about one or more electronic components, as described herein. In the embodiment depicted, electronic enclosure 700 includes a main surface 701 and sidewall(s) 702 which include sidewall corners 710. An inner surface of electronic enclosure 700 would include an inner main surface, and an inner-sidewall surface corresponding to main surface 701 and sidewall(s) 702, respectively, with the inner main surface and inner-sidewall surfaces being covered, at least in part, by a tamper-respondent sensor such as described herein. A power supply 705 or battery for the tamper-respondent sensor is located, in this embodiment, external to the secure volume, with the sensor again being configured to trip and destroy any protected or critical data if the power supply or battery is tampered with. Electronic enclosure 700 may be adhered or mechanically affixed to multilayer circuit board 410, which as noted above, may include its own embedded tamper-respondent sensor layer(s).

In one or more implementations, the tamper-respondent assembly may incorporate or include an air path to adjust air pressure within the secure volume of the assembly to equalize with air pressure external to the assembly. By way of example, an air vent may be provided through electronic enclosure 700, and this air vent may be in fluid communication with a vent structure disposed between the electronic enclosure and the multilayer circuit board. For instance, the vent structure may comprise a low profile vent structure sandwiched between overlapping regions of a tamper-respondent sensor covering an inner-sidewall surface of the electronic enclosure. The vent structure includes at least one air passage coupling in fluid communication the secure volume defined by the assembly and the air vent in electronic enclosure 700. Note that in this context "in fluid communication" refers to air or gas communication being established between the secure volume provided by the tamper-respondent assembly, and the air vent through the electronic enclosure.

Figure 8A:
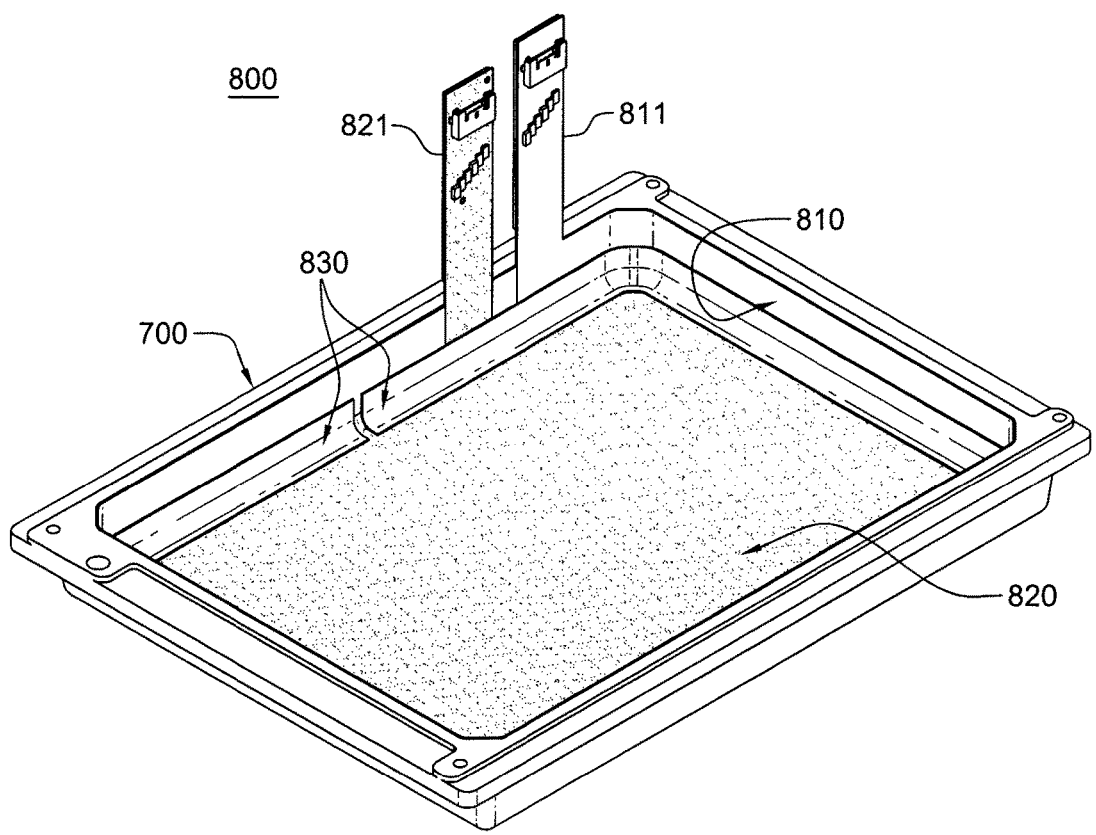
FIG. 8A depicts an underside, perspective view of one embodiment of a tamper-respondent assembly comprising an electronic enclosure and multiple tamper-respondent sensors, in accordance with one or more aspects of the present invention.
Figure 8B:
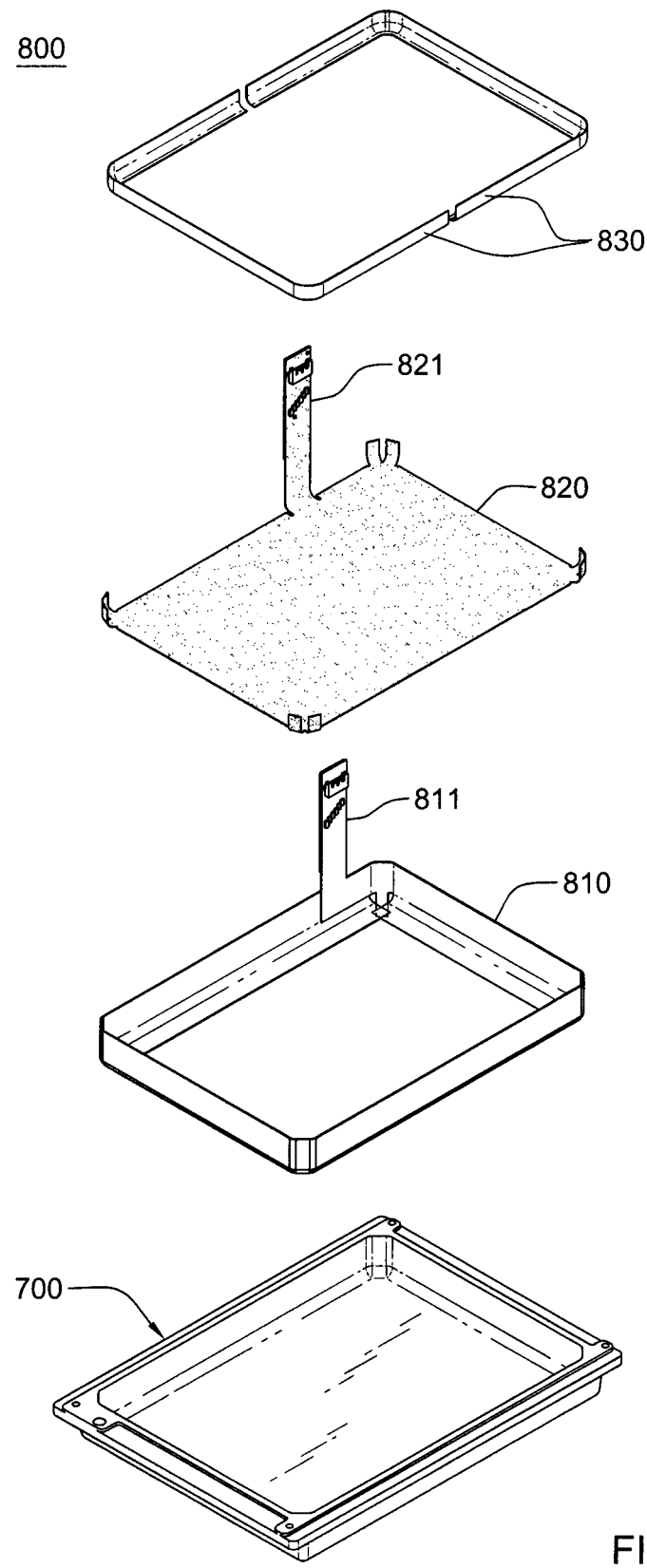
FIG. 8B depicts an exploded view of the tamper-respondent assembly of FIG. 8A, in accordance with one or more aspects of the present invention.

FIGS. 8A & 8B depict underside, isometric views of one embodiment of a tamper-respondent assembly employing electronic enclosure 700. Referring collectively to FIGS. 8A & 8B, in one or more implementations, tamper-respondent assembly 800 includes electronic enclosure 700 which, as noted, is to enclose, at least in part, one or more electronic components or an electronic assembly to be protected, and associated with, for instance, a multilayer circuit board. Electronic enclosure 700 includes an inner main surface, and an inner-sidewall surface including at least one inner-sidewall corner, such as described above in connection with FIGS. 7. Further, tamper-respondent assembly 800 includes a tamper-respondent electronic circuit structure which includes at least one tamper-respondent sensor mounted to and covering, at least in part, the inner surface(s) of electronic enclosure 700. As explained further below, the tamper-respondent sensor(s) is configured so as to facilitate good contact, and good adhesion, of the sensor to the inner surfaces of the enclosure, such as, for instance, the one or more inner-sidewall corners of the electronic enclosure 700, to provide secure coverage of the tamper-respondent sensor(s) over the inner surface(s) of the electronic enclosure.

As illustrated, in one or more implementations, the tamper-respondent electronic circuit structure associated with electronic enclosure 700 may include an inner-sidewall tamper-respondent sensor 810 and an inner main surface tamper-respondent sensor 820, along with a security band or element 830. In the illustrated example, inner-sidewall tamper-respondent sensor 810 may be formed with an integrated flex ribbon cable or extension 811 to facilitate electrical connection of the at least one resistive network within inner-sidewall tamper-respondent sensor 810 to appropriate monitor circuitry (not shown) disposed within, for instance, the secure volume defined, at least in part, by the tamper-respondent assembly of FIGS. 8A & 8B. Similarly, inner main surface tamper-respondent sensor 820 may be configured with an integrated flex ribbon cable or extension 821 to facilitate electrical connection of inner main surface tamper-respondent sensor 820 to the monitor circuitry, as well. A bonding agent (discussed below), such as a thermoset adhesive, may be employed to adhere inner-sidewall tamper-respondent sensor 820 to the inner-sidewall surface and to inner-sidewall corners. A similar adhesive could be used to adhere inner main surface tamper-respondent sensor 820 to inner main surface and to inner-sidewall tamper-respondent sensor 810 where the sensors overlap. Security band 830 may further be adhesively secured over the overlap between inner main surface tamper-respondent sensor 820 and inner-sidewall tamper-respondent sensor 810 covering, in one or more implementations, transition regions between the inner-sidewall surface and the inner main surface around the inner perimeter of electronics enclosure 700.

Note that, in the example provided in FIGS. 8A & 8B, inner-sidewall tamper-respondent sensor 810 and inner main surface tamper-respondent sensor 820 are discrete tamper-respondent sensors that overlap, at least in part, and facilitate defining a secure volume about the at least one electronic component to be protected. For instance, the secure volume may be defined by flipping over and securing the illustrated tamper-respondent assembly of FIGS. 8A & 8B to a multilayer circuit board with an embedded tamper-respondent sensor, such as described above.

Figure 9A:
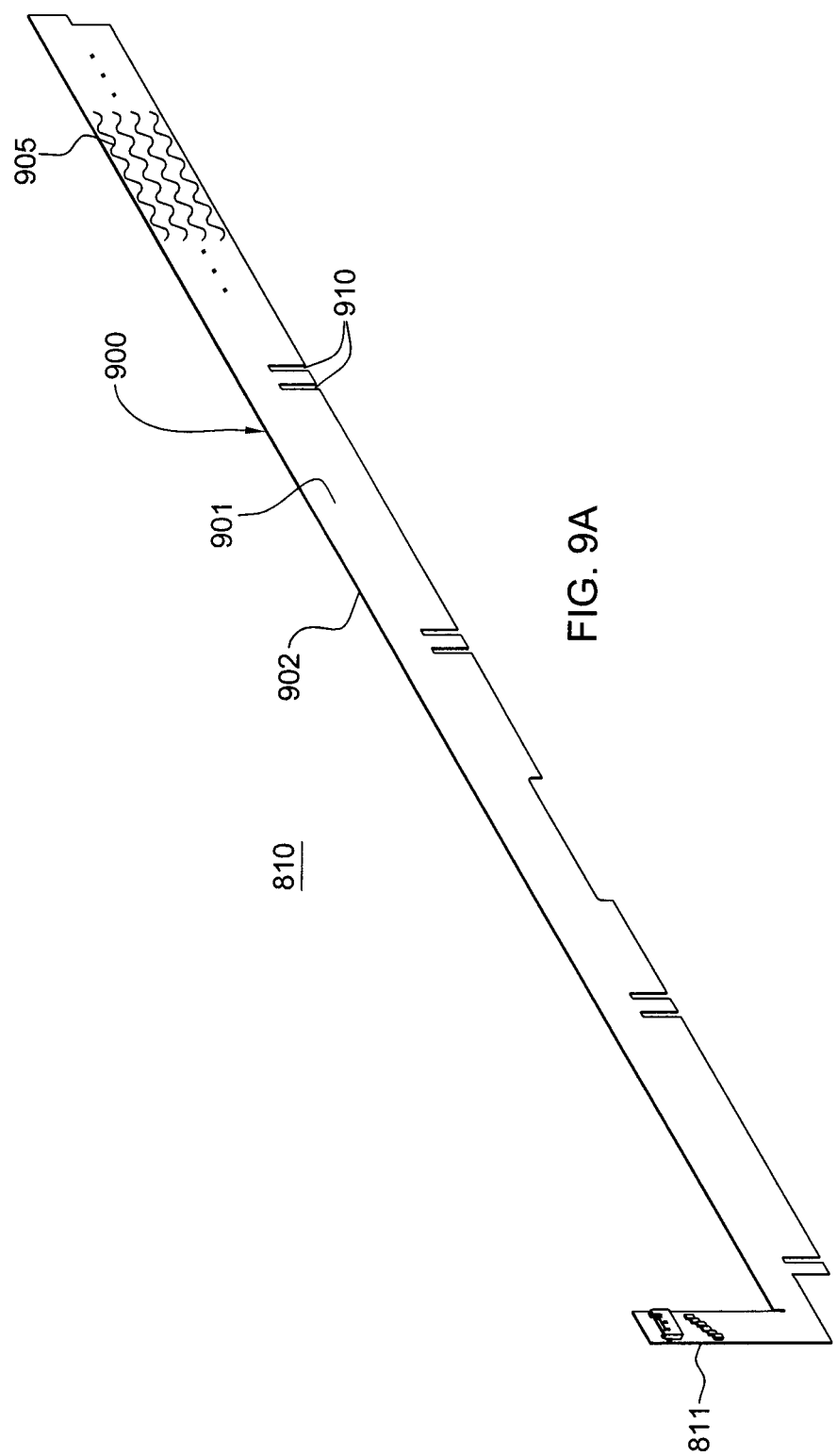
FIG. 9A is an isometric view of one embodiment of an inner-sidewall tamper-respondent sensor for covering an inner-sidewall surface of the electronic enclosure, in accordance with one or more aspects of the present invention.

FIG. 9A depicts one embodiment of inner-sidewall tamper-respondent sensor 810 of FIGS. 8A & 8B. In this embodiment, inner-sidewall tamper-respondent sensor 810 includes at least one first layer 900 having opposite first and second sides 901, 902, and circuit lines 905 extending substantially over all of the flexible layer, and forming at least one tamper-detect network, such as described herein. For instance, circuit lines 905 may be disposed on at least one of first side 901 or second side 902 of the at least one flexible layer 900. Note that the at least one flexible layer 900 may be fabricated as a conventional security sensor layer, or be fabricated as an enhanced, tamper-respondent sensor such as described herein. As noted, extension 811 may extend from inner-sidewall tamper-respondent sensor 810 to facilitate electrical connection of the at least one resistive network of the inner-sidewall tamper-respondent sensor 810 to appropriate monitor circuitry (not shown) disposed within, for instance, the secure volume defined, at least in part, by the tamper-respondent assembly of FIGS. 8A & 8B. As illustrated, in one or more implementations, inner-sidewall tamper-respondent sensor 810 is of sufficient length to encircle the inside of the electronic enclosure, covering the inner-sidewall surface thereof, and overlap at its ends. Further, multiple slots 910 are provided within inner-sidewall tamper-respondent sensor 810. These multiple slots 910 are sized and positioned along the inner-sidewall tamper-respondent sensor so as to approximately align (in one or more embodiments) to respective inner-sidewall corners of the electronic enclosure to facilitate good contact, and good adhering, and bending the sensor within the inner-sidewall corners of the electronic enclosure, for instance, by allowing for regions of overlap of the inner-sidewall tamper-respondent sensor on itself.

Figure 9B:
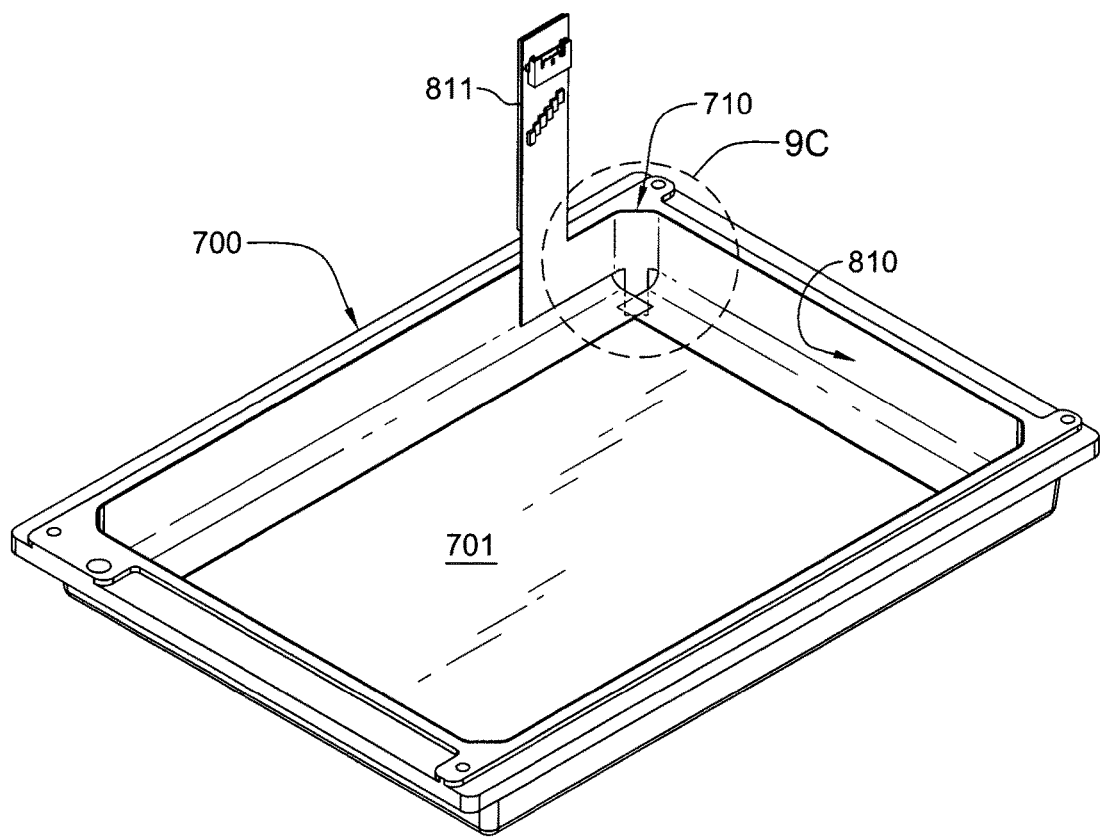
FIG. 9B depicts an underside, isometric view of the electronic enclosure and inner-sidewall tamper-respondent sensor of FIGS. 8A & 8B, with the inner-sidewall tamper-respondent sensor shown positioned over the inner-sidewall surface of the electronic enclosure, in accordance with one or more aspects of the present invention.
Figure 9C:
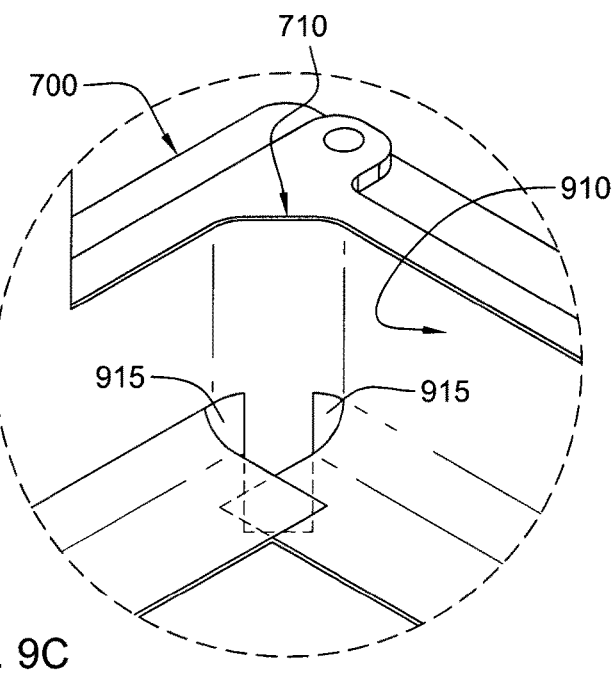
FIG. 9C is an enlarged depiction of the tamper-respondent assembly of FIG. 9B, illustrating region 9C thereof, in accordance with one or more aspects of the present invention.

FIGS. 9B & 9C depict one embodiment of inner-sidewall tamper-respondent sensor 810 mounted within electronic enclosure 700. As illustrated, in the exemplary embodiment, the inner-sidewall tamper-respondent sensor includes first and second slots that respectively overlie, at least in part, the first and second curved-sidewall portions of the associated inner-sidewall corner 710 to be covered. These first and second slots are spaced apart to reside at opposite sides of the flat, angled-sidewall portion of the inner-sidewall corner 710, and facilitate reducing the amount of material in the corner and thereby enhance good contact and adhesion of the inner-sidewall tamper-respondent sensor 810 to the inner-sidewall surface of the electronic enclosure, including at the inner-sidewall corners thereof, while also reducing stress on the sensor within the corner(s). For instance, the multiple slots 910 allow for overlapping of the inner-sidewall tamper-respondent sensor on itself at the inner-sidewall corners, as illustrated. Note that, in this configuration, the inner-sidewall tamper-respondent sensor 810 has a width which allows the sensor to cover the transition regions, as well as extend over, in part, the inner main surface of electronic enclosure 700. Note also that one or more uncovered regions 915 may result from the presence of the slots when the inner-sidewall tamper-respondent sensor 810 is wrapped around the inner-sidewall surface as shown, exposing portions of the inner-sidewall surface at the inner-sidewall corner(s), for instance, along the seams where the inner-sidewall tamper-respondent sensor overlaps at the corner. As explained below, these regions 915 may be covered or protected by inner main surface tamper-respondent sensor 820 corner tabs once that sensor and its corner tabs are adhered to the assembly. This is illustrated, by way of example, in FIGS. 10A-10C.

Figure 10A:
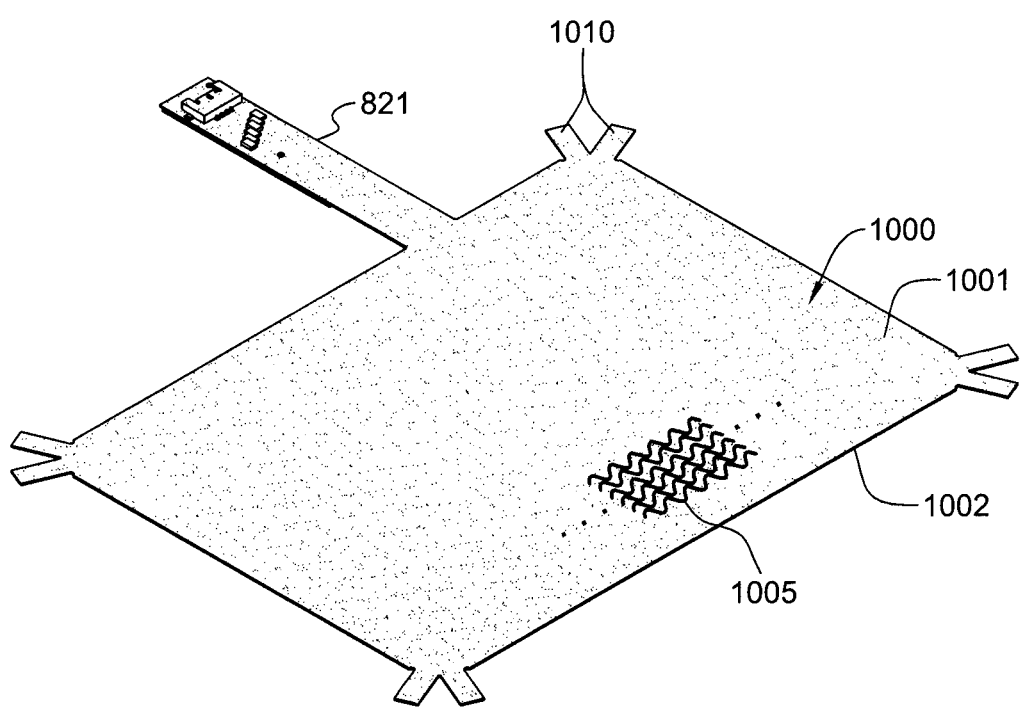
FIG. 10A is an enlarged depiction of the inner main surface tamper-respondent sensor embodiment illustrated in FIGS. 8A & 8B, in accordance with one or more aspects of the present invention.
Figure 10B:
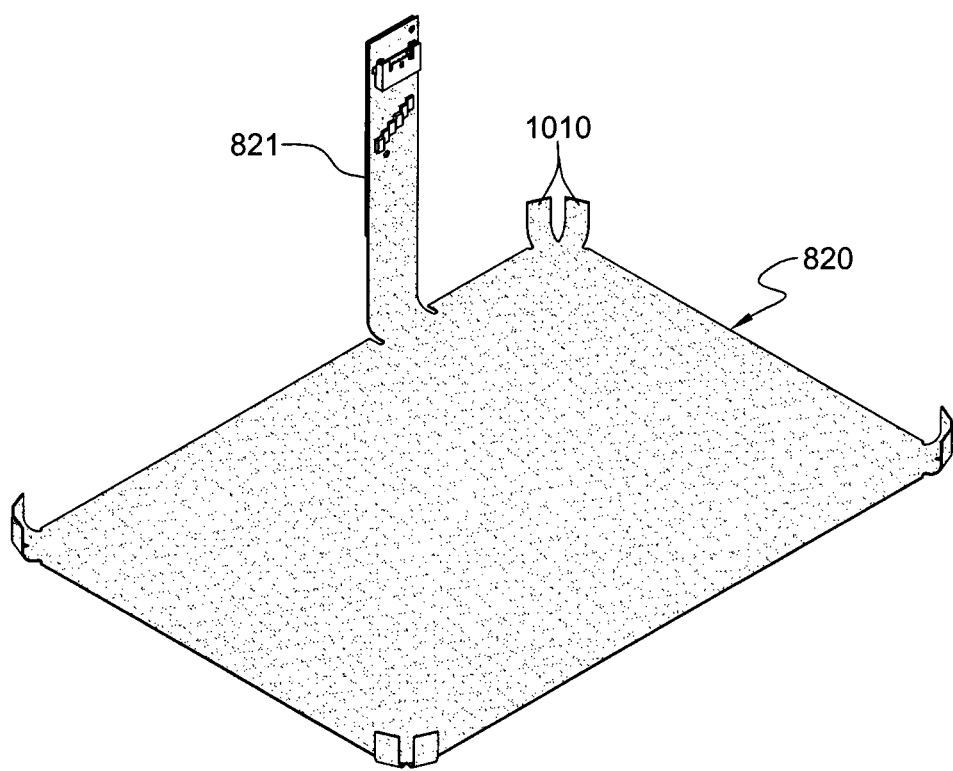
FIG. 10B depicts the inner main surface tamper-respondent sensor of FIG. 10A, with the corner tabs shown raised for positioning, as illustrated in FIGS. 8A & 8B, in accordance with one or more aspects of the present invention.
Figure 10C:
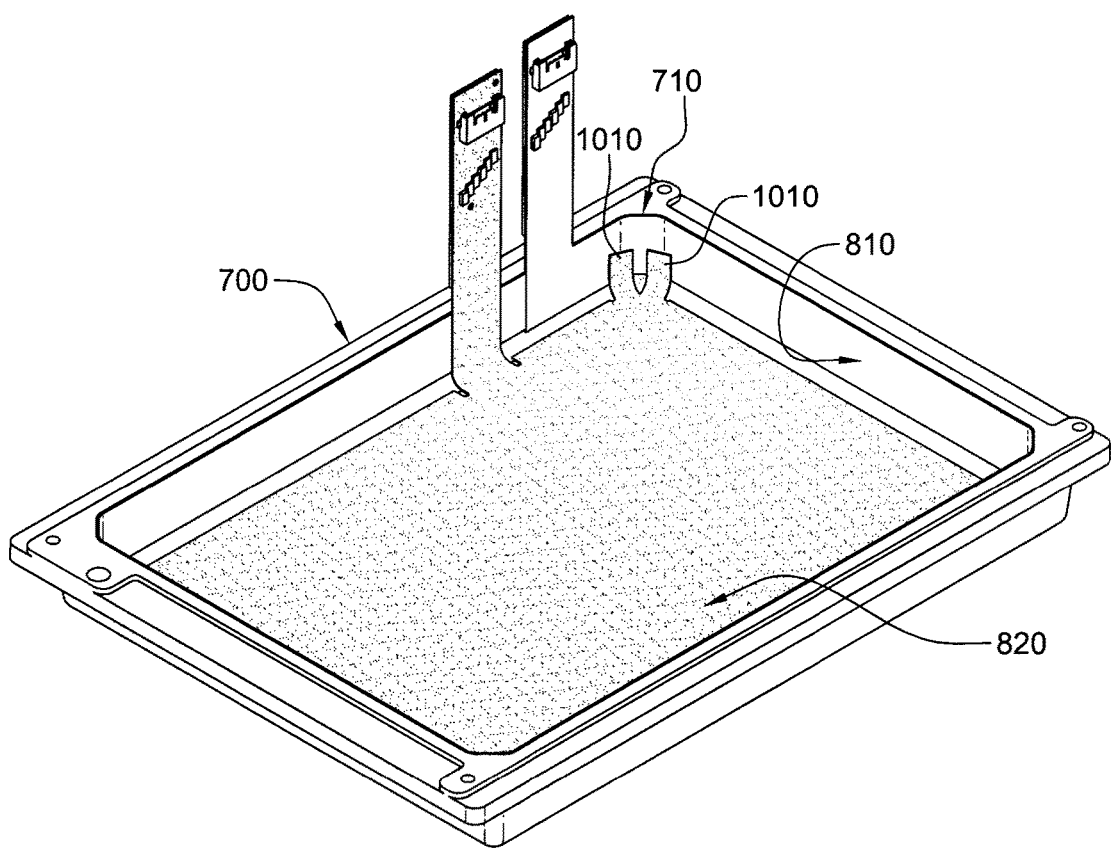
FIG. 10C depicts the tamper-respondent assembly of FIGS. 8A & 8B, with the inner main surface tamper-respondent sensor positioned therein, and with the security elements(s) removed, in accordance with one or more aspects of the present invention.

Referring collectively to FIGS. 10A-10C, inner main surface tamper-respondent sensor 820 includes at least one flexible layer 1000 having opposite first and second sides 1001, 1002, and circuit lines 1005 extending substantially over all of the flexible layer 1000 and forming at least one tamper-detect network, such as described herein. For instance, circuit lines 1005 are disposed on one or both of first side 1001 and second side 1002 of the at least one flexible layer 1000, as described. As noted above, the at least one flexible layer 1000 may be fabricated as a conventional security sensor layer, or be fabricated as one of the enhanced, tamper-respondent sensors described herein. In particular, although illustrated as a non-formed, flexible layer, the at least one flexible layer 1000 of inner main surface tamper-respondent sensor 820 could comprise a flexible layer, such as described above. As noted, extension 821 may be formed integral with inner main surface tamper-respondent sensor 820 to facilitate electrical connection of the at least one associated resistive network to monitor circuitry (not shown) within the secure volume being defined, at least in part, by the tamper-respondent assembly of FIGS. 8A & 8B; for instance, in association with a multilayer circuit board having an embedded tamper-respondent sensor therein, as described above.

In the depicted configuration, multiple corner tabs 1010 are provided, with at least one corner tab 1010 being provided at the at least one inner-sidewall corner. In the exemplary embodiment illustrated, two corner tabs 1010 are provided at each corner of the inner main surface tamper-respondent sensor 820. These corner tabs 1010 include circuit lines 1005 (FIG. 10A) and are sized to cover a respective one of the uncovered regions 915 in inner-sidewall tamper-respondent sensor and enclosure assembly which remain after securing inner-sidewall tamper-respondent sensor 810 to electronic enclosure 700, as illustrated in FIGS. 10B & 10C. In particular, those skilled in the art should understand that corner tabs 1010 include respective portions of the at least one tamper-detect network provided by inner main surface tamper-respondent sensor 820, such that if an attempt were made to breach the tamper-respondent assembly 800 through the underlying, uncovered regions 915 of the inner-sidewall surface, the respective corner tab would be contacted, thereby resulting in detection of the attempted breach.

As noted above in connection with FIGS. 8A & 8B, reinforcement of the overlap between inner-sidewall tamper-respondent sensor 810 (FIG. 8A) and inner main surface tamper-respondent sensor 820 (FIG. 8A) may be provided, in one or more implementations, by one or more physical security structures, such as security band or element 830. One potential point of attack for a tamper-respondent assembly such as described herein would be at an overlap between two or more tamper-respondent sensors, such as at an overlap between an inner-sidewall tamper-respondent sensor and an inner main surface tamper-respondent sensor. For instance, an attack on a tamper-respondent assembly could entail drilling through the enclosure and chemically attaching an overlapped bond area between two tamper-respondent sensors of the tamper-respondent electronic circuit structure, such as the overlap area where inner main surface tamper-respondent sensor 820 is adhesively secured over inner-sidewall tamper-respondent sensor 810. To address this concern, a physical security structure, such as one or more security bands or elements 830, may be provided. Note that security band 830 is one embodiment only of a physical security structure which could be employed to overlie and physically secure in place, at least in part, one or more tamper-respondent sensors covering one or more inner surfaces of an electronic enclosure, such as described herein.

In general, in one or more implementations, disclosed herein is a tamper-respondent assembly which includes an electronic enclosure to enclose, at least in part, at least one electronic component to be protected, wherein the electronic enclosure includes an inner surface. The tamper-respondent assembly also includes a tamper-respondent electronic circuit structure comprising a tamper-respondent sensor lining or covering, at least in part, the inner surface of the electronic enclosure. The tamper-respondent sensor may include a flexible layer having opposite first and second sides, and circuit lines substantially covering at least one of the first side or the second side of the flexible layer, forming at least one tamper-respondent network, such as described herein.

Figure 11:
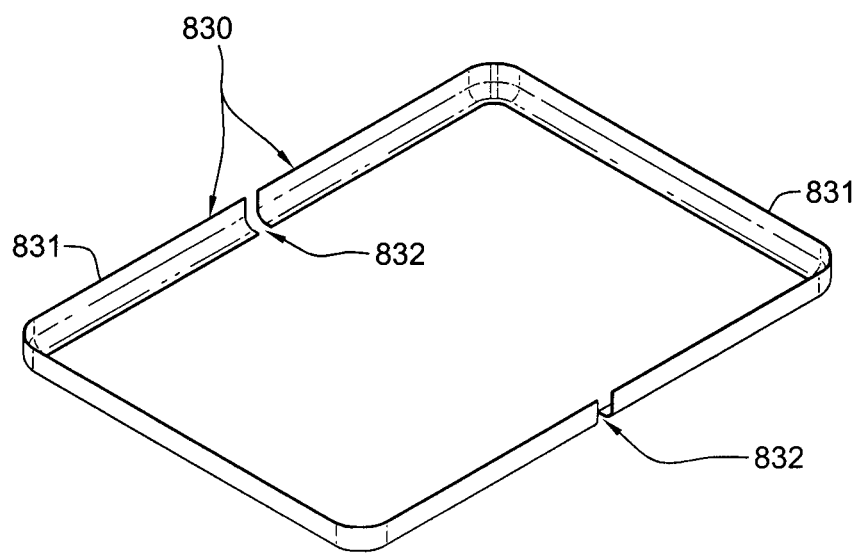
FIG. 11 is a perspective view of the security element(s) illustrated in FIGS. 8A & 8B for the tamper-respondent assembly, in accordance with one or more aspects of the present invention.

The tamper-respondent assembly may further include a physical security structure, such as at least one security element, that overlies and physically secures in place, at least in part, the tamper-respondent sensor covering, at least in part, the inner surface of the electronic enclosure. In the embodiment of FIGS. 8A & 8B, security band 830 is illustrated which includes multiple security elements 831, as shown in enlarged view in FIG. 11. Note that the security structure, such as security band 830, could comprise a single element or multiple elements, depending on the desired configuration. In the example of FIGS. 8A, 8B & 11, two substantially identical, U-shaped security elements 831 are illustrated, by way of example only. In the depicted embodiment, security elements 831 are spaced apart, with gaps 832 therebetween. By providing two or more security elements 831, to define a desired physical security structure (such as security band 830) manufacturing tolerances may be better accommodated within the tamper-respondent assembly. By way of example, the gaps 832 between adjacent security elements of the multiple, distinct security elements 831, may be on the order of several millimeters. Note that although illustrated as two security elements 831, any number of physical security elements could be provided within the tamper-respondent assembly, and any number of security structures, such as multiple security bands or plates, could be provided within the tamper-respondent assembly as desired to provide additional mechanical securing of the tamper-respondent sensor(s) in place over the inner surface of the electronic enclosure.

In the example of FIGS. 8A, 8B & 11, the physical security structure is configured as a security band or collar comprising multiple distinct security elements 831 which extends substantially fully around the inner perimeter of the electronic enclosure 700. The security band 830 is sized and positioned to overlie and physically secure in place at least the overlap of the inner main surface tamper-respondent sensor and the inner-sidewall tamper-respondent sensor, as illustrated in FIG. 8A. In one or more implementations, security band 830 may be adhesively secured to the tamper-respondent sensors. Note that in this example, security band 830, comprising security elements 831, extends around the inner perimeter, including through the inner-sidewall corners, as illustrated in FIG. 8A. In this manner, security elements 831 advantageously overlie and secure in place the overlap(s) of the inner-sidewall tamper-respondent sensor and the inner main surface tamper-respondent sensor at the inner-sidewall corners of the electronic enclosure. By way of example, in the embodiment depicted, security band 830, or more particularly, security elements 831, overlie and physically secure in place the multiple corner tabs 1010 (FIG. 10C) projecting from the inner main surface tamper-respondent sensor 820 at the inner-sidewall corners of the electronic enclosure. This advantageously prevents an attack against the tamper-respondent assembly through the areas lined by the multiple corner tabs projecting from the inner main surface of the tamper-respondent sensor. The security band 830 creates a mechanical barrier that prevents the tamper-respondent sensors from being separated.

In one or more enhanced embodiments, the security element(s) defining the security band, or more generally, the physical security structure, are formed (for instance, by stamping) a metal material, or metal alloy, such as copper, soft stainless steel, etc. Further, the metal security element(s) may advantageously be electrically connected to ground to further enhance detection capabilities of the tamper-respondent assembly. By forming the security element(s) of a metal that is difficult to drill through, then, if an attempt were made to drill through the security element, metal fragments would be created, which potentially could be pulled into the sensor layer(s) lining the inner surface of the electronic enclosure, which would result in a greater chance of shorting or otherwise damaging the circuit lines forming the one or more tamper-respondent networks of the sensor during the attack, and thus enhance detection capability of the tamper-respondent sensor. Further, by electrically grounding the security element(s), then a drill contacting the grounded security element(s) after drilling through one or more tamper-respondent sensors would be more likely to short one or more of the circuit lines forming the at least one tamper-detect network in the associated tamper-respondent sensor(s). By grounding the security element(s), another path for current to flow is established, which advantageously increases the likelihood of detecting an attempt to tamper with the tamper-respondent assembly. Note that grounding of the security element(s) could be by any means, such as by electrically connecting the elements to one or more ground lines on the electronic assembly being protected by the tamper-respondent assembly, or (in certain of the embodiments disclosed herein) by electrically connecting the elements to one or more ground planes within the multilayer circuit board forming, in part, the secure volume about the electronic assembly being protected. In one or more implementations, the security element(s), or more generally, the security band or physical security structure, may be pre-formed (e.g., by stamping) into the desired shape, for example, to accommodate and overlie the overlap between the inner-sidewall tamper-respondent sensor and the inner main surface tamper-respondent sensor, such as depicted in FIG. 8A.

One fabrication issue with providing a tamper-respondent assembly such as described above in connection with FIGS. 7-11 is that the adhesive used within the electronic enclosure may require a pressure cure at an elevated temperature to ensure intimate contact between, for instance, one or more of the sensors and the inner surface of the electronic enclosure; that is, to ensure that there are no voids between the surfaces. Existing techniques for achieving pressure cure adhesion may include vacuum bagging or use of a pressure cure oven, both of which are expensive. Further, the existing pressure cure approaches can be tedious; for instance, vacuum bagging a large volume of parts may be difficult, or even logistically prohibitive.

Described herein below with reference with FIGS. 12A-14C are enhanced techniques and assembly apparatuses for, for instance, aiding in good adhesion of tamper-respondent sensors to an electronic enclosure, such as a metal electronic enclosure, to provide a secure volume about one or more electronic components to be protected. The assembly apparatuses and processes disclosed may also be generalized to facilitating securing any surface-mount element to an inner surface of a container using a pressure-sensitive or pressure cure adhesive.

Generally stated, therefore, in one or more aspects, an assembly apparatus is disclosed herein which includes a pressure cure fixture or element that is sized to reside within a container, such as an electronic enclosure, and facilitate applying pressure during heat curing to an adhesive disposed over an inner surface of the container. The fixture is formed of a material with a higher coefficient of thermal expansion (CTE) than the container, and is sized to correspond, at least in part, to an inner space of the container, while allowing for the adhesive and a surface-mount element, such as a tamper-respondent sensor, to be disposed between the pressure cure fixture and the inner surface of the container. By way of example, the adhesive may comprise a pressure-sensitive adhesive, such as an adhesive sheet layer with a pressure-sensitive adhesive on at least one side. Such an adhesive may be particularly advantageous when applying a surface-mount element to an inner-sidewall of the container. The pressure cure fixture, which may be sized to substantially fill the inner space of the container, is configured and the material thereof is chosen so that when heated, the fixture expands greater than the container and imparts a desired pressure to the surface-mount element and adhesive to facilitate securing the surface-mount element to the inner surface of the container. Achieving a desired pressure on the surface-mount element and adhesive may be accomplished by selecting the material of the pressure cure fixture dependent, in part, on the material of the container, as well as forming or machining the fixture to have a desired minimal spacing or gap between the fixture and the surface-mount element at room temperature. For instance, when assembled at room temperature, the gap between the pressure cure fixture and surface-mount element or inner surface of the container may be only on the order of a few millimeters or less.

In one or more implementations, the adhesive may comprise an adhesive sheet layer, with at least one side of the adhesive sheet layer comprising a pressure-sensitive adhesive. Further, the material of the pressure cure fixture may be, for instance, a rubber or silicone material, such as silicone sponge rubber, or may be teflon, and the inner surface may be an inner-sidewall surface or inner main surface of the container, where the surface-mount element mounts to the inner surface of the container via the adhesive. Alternatively, in one or more implementation, the adhesive may comprise a liquid adhesive to be pressure cured. By way of example, the adhesive may also include one or more compounds, materials or elements to enhance thermal conductivity of the adhesive once cured in place.

In one or more embodiments, the assembly apparatus further includes a base fixture, upper fixture, and clamp. The base fixture includes an opening sized to receive the container with a pressure cure fixture, surface-mount element and adhesive disposed therein, and the clamp clamps or affixes the upper fixture to the base fixture. In one or more embodiments, the upper fixture may include or be subject to spring biasing (for instance, via a spring biasing plate disposed over the upper fixture, and affixed to the base fixture) to, for instance, apply uniform pressure to the pressure cure fixture to force the fixture towards, for instance, the inner main surface of the container. The base fixture, upper fixture and clamp facilitate, in part, alignment of the surface-mount element to an edge of the container during the heating or curing of the adhesive and imparting of the pressure to the surface-mount element and adhesive.

In one or more implementations, the adhesive is a first adhesive, the pressure cure fixture is a first pressure cure fixture, the material of the first pressure cure fixture is a first material, and the surface-mount element is a first surface-mount element. Further, the assembly may include a second pressure cure fixture to facilitate adhering a second surface-mount element to the inner surface of the container after the first surface-mount element has been adhered to the inner surface of the container. The second pressure cure fixture may be formed of a second material with a higher coefficient of thermal expansion (CTE) than the container. The second pressure cure fixture may be sized to correspond, at least in part, to the inner space of the container while allowing for the first surface-mount element, the first adhesive, the second surface-mount element, and the second adhesive to be disposed between the second pressure cure fixture and the inner surface of the container. When heated, the second pressure cure fixture expands greater than the container and imparts pressure to the second surface-mount element and the second adhesive to facilitate securing the second surface-mount element to the inner surface of the container. As one example, the first surface-mount element may be an inner-sidewall tamper-respondent sensor, and the second surface-mount element may be an inner main surface tamper-respondent sensor. Further, by way of example, the first material and the second material of the first and second pressure cure fixtures may be the same or different materials, and the first and second adhesives may be different types of adhesives. For instance, at least one of the different types of adhesives may include a pressure-sensitive adhesive. Further, the materials of the first and second pressure cure fixtures may include at least one of silicone or teflon. Still further, in one or more implementations, the container may be an electronic enclosure formed of a metal, such as aluminum or copper, or a metal alloy.

Note generally, the assembly apparatuses and processes disclosed herein utilize a specially configured high CTE material placed within a container or enclosure along with a surface-mount element, such as a tamper-respondent sensor, at room temperature prior to curing. The adhesive employed may include, for instance, a pressure-sensitive adhesive. Once assembled, the assembly is placed within an oven for curing of the adhesive, and as temperature rises, the high CTE material expands at a rate much higher than the container, and thereby exerts the desired pressure outwards towards the inner wall of the container, and thereby facilitates void-free bonding of the surface-mount element to the container. As the temperature cools after curing, the high CTE material shrinks back to its original size, and is readily removed from the container. The high CTE material(s) of the pressure cure fixture may be chosen, in part, so that the material does not adhere itself to the adhesive in the event that any adhesive contacts the fixture. Advantageously, the assembly apparatus disclosed herein is inexpensive, with the high CTE pressure cure fixture being reusable, and with the process employing, for instance, a standard batch oven.

Figure 12A:
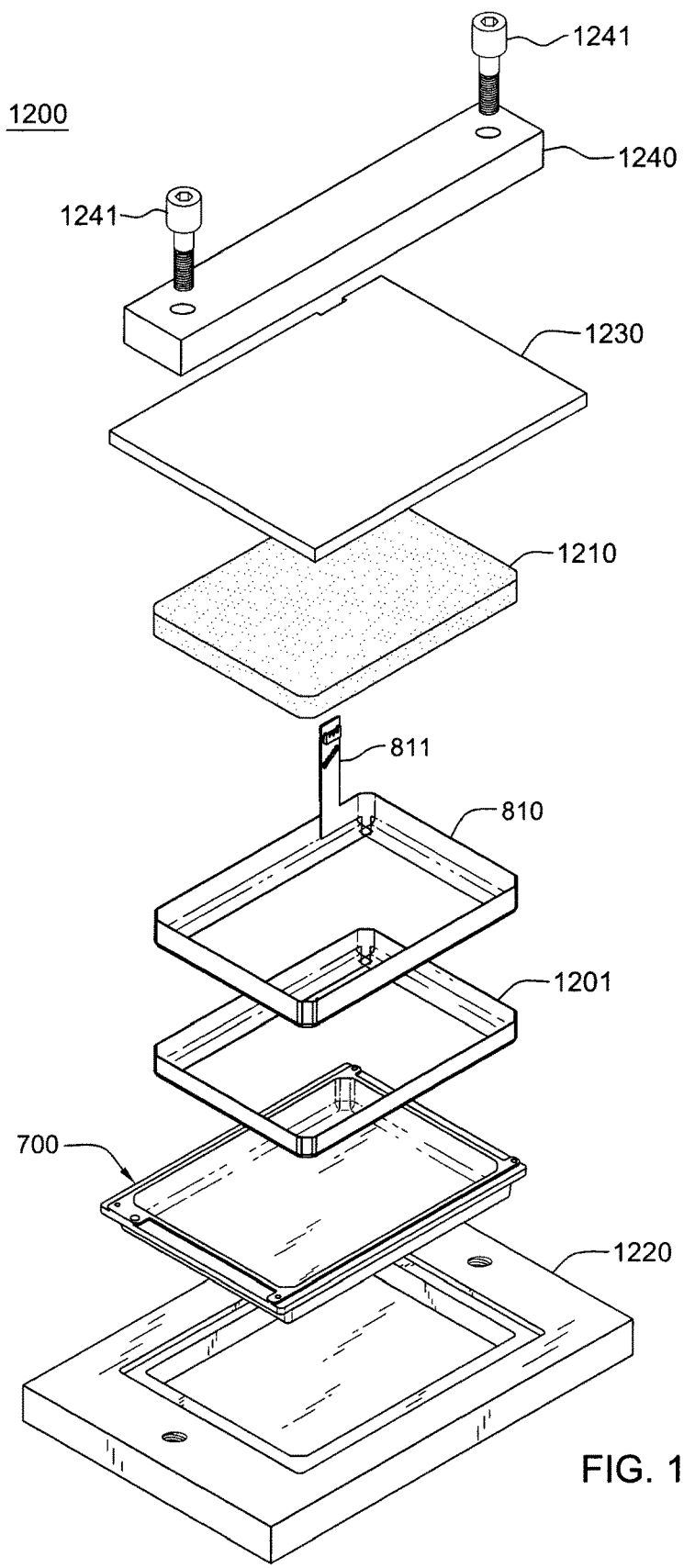
FIG. 12A is an exploded view of an assembly apparatus for affixing, for instance, an inner-sidewall tamper-respondent sensor of a tamper-respondent assembly to the inner-sidewall of an electronic enclosure such as depicted in FIGS. 7-8B, in accordance with one or more aspects of the present invention.
Figure 12C:
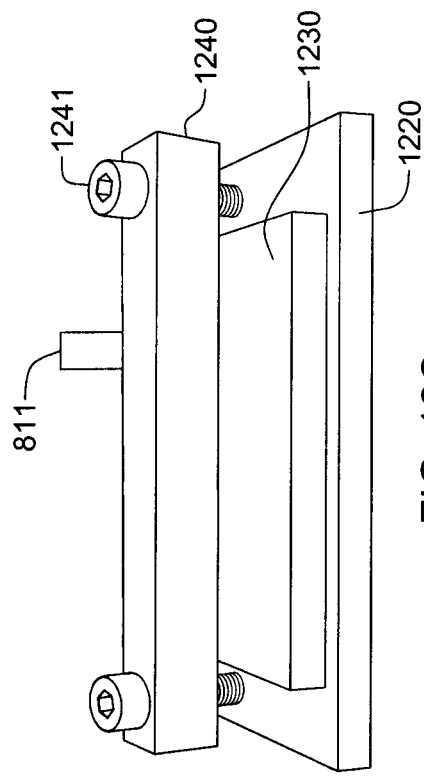
FIG. 12C depicts the assembly apparatus of FIGS. 12A & 12B assembled to undergo heating to secure the inner-sidewall tamper-respondent sensor to the inner-sidewall of the electronic enclosure, in accordance with one or more aspects of the present invention.
Figure 12B:
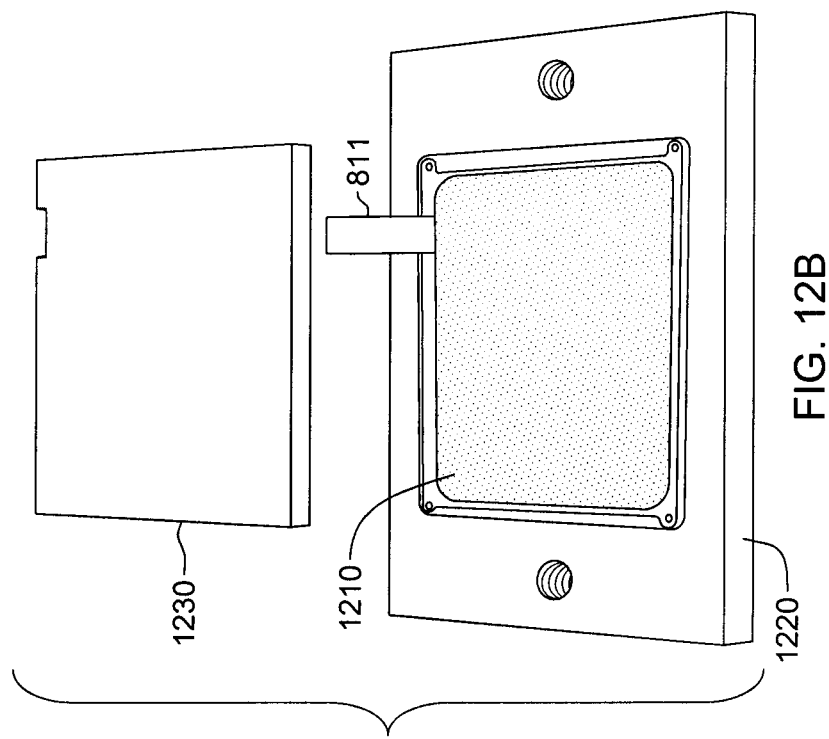
FIG. 12B depicts the assembly apparatus of FIG. 12A, with the electronic enclosure, adhesive, inner-sidewall tamper-respondent sensor, and pressure cure fixture shown positioned within the base fixture, in accordance with one or more aspects of the present invention.

FIGS. 12A-12C depict one embodiment of an assembly apparatus 1200, in accordance with one or more aspects of the present invention. By way of example, the assembly apparatus of FIG. 12A is configured to facilitate forming a tamper-respondent assembly, such as described above in connection with FIGS. 7-11. As noted, however, the assembly apparatus and process disclosed herein can be readily adapted to facilitate securing any surface-mount element to an inner surface of a recess or void in a structure, generally referred to herein as a container.

The electronic enclosure 700 depicted is presented as one example of a container having an inner surface to which one or more surface-mount elements, such as inner-sidewall tamper-respondent sensor 810 are to be affixed. As noted above, the tamper-respondent assembly includes a tamper-respondent electronic circuit structure which includes, in one or more embodiments, at least one tamper-respondent sensor 810 mounted to and covering, at least in part, the inner surface(s) of electronic enclosure 700. The tamper-respondent sensor(s) is configured (for example, is flexible) so as to facilitate good contact, and good adhesion of the sensor to the inner surface of the enclosure.

Figure 13A:
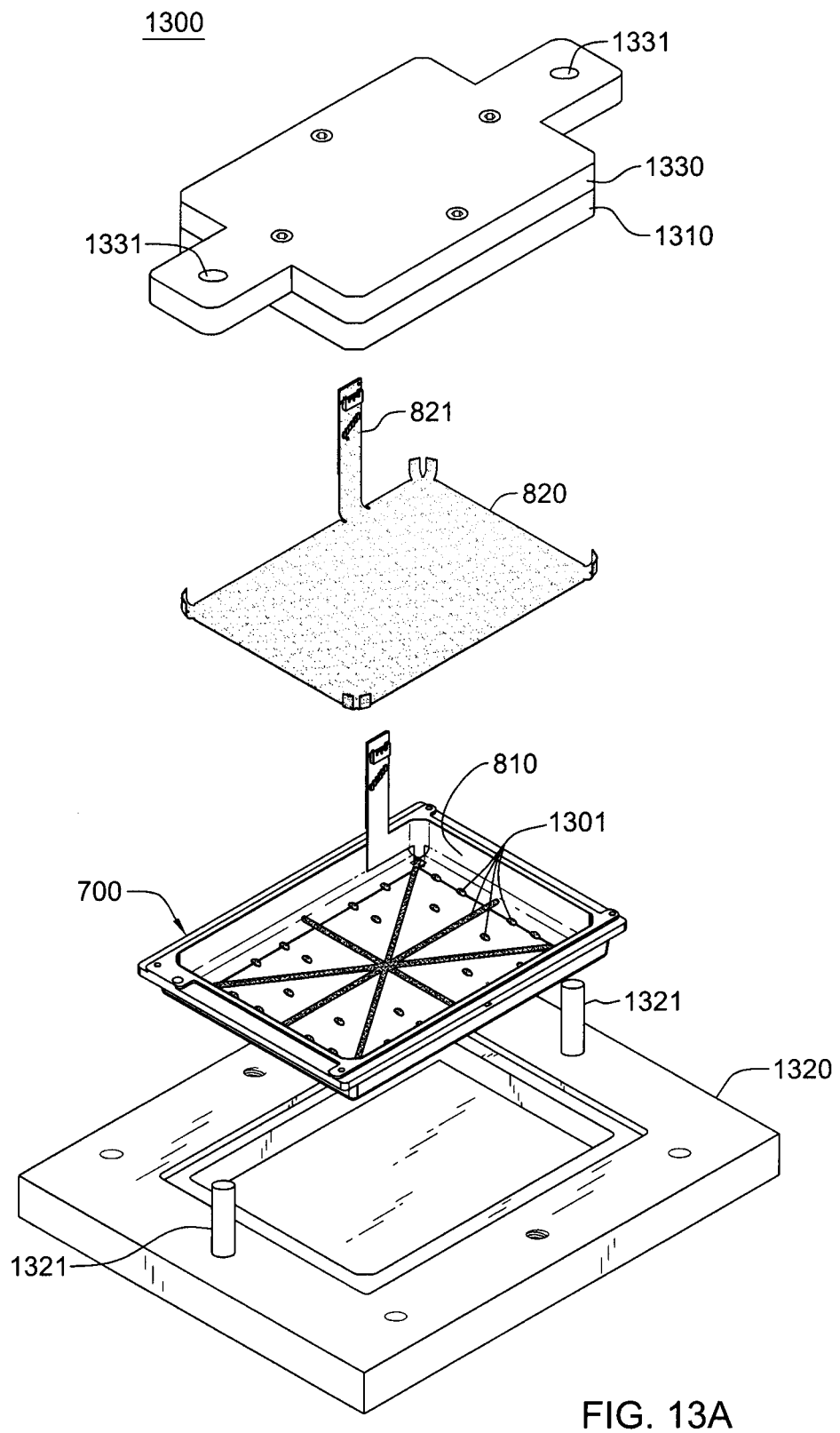
FIG. 13A depicts an exploded view of an assembly apparatus for affixing, for instance, an inner main surface tamper-respondent sensor to an inner main surface of the electronic enclosure of FIGS. 12A-12C, in accordance with one or more aspects of the present invention.
Figure 14A:
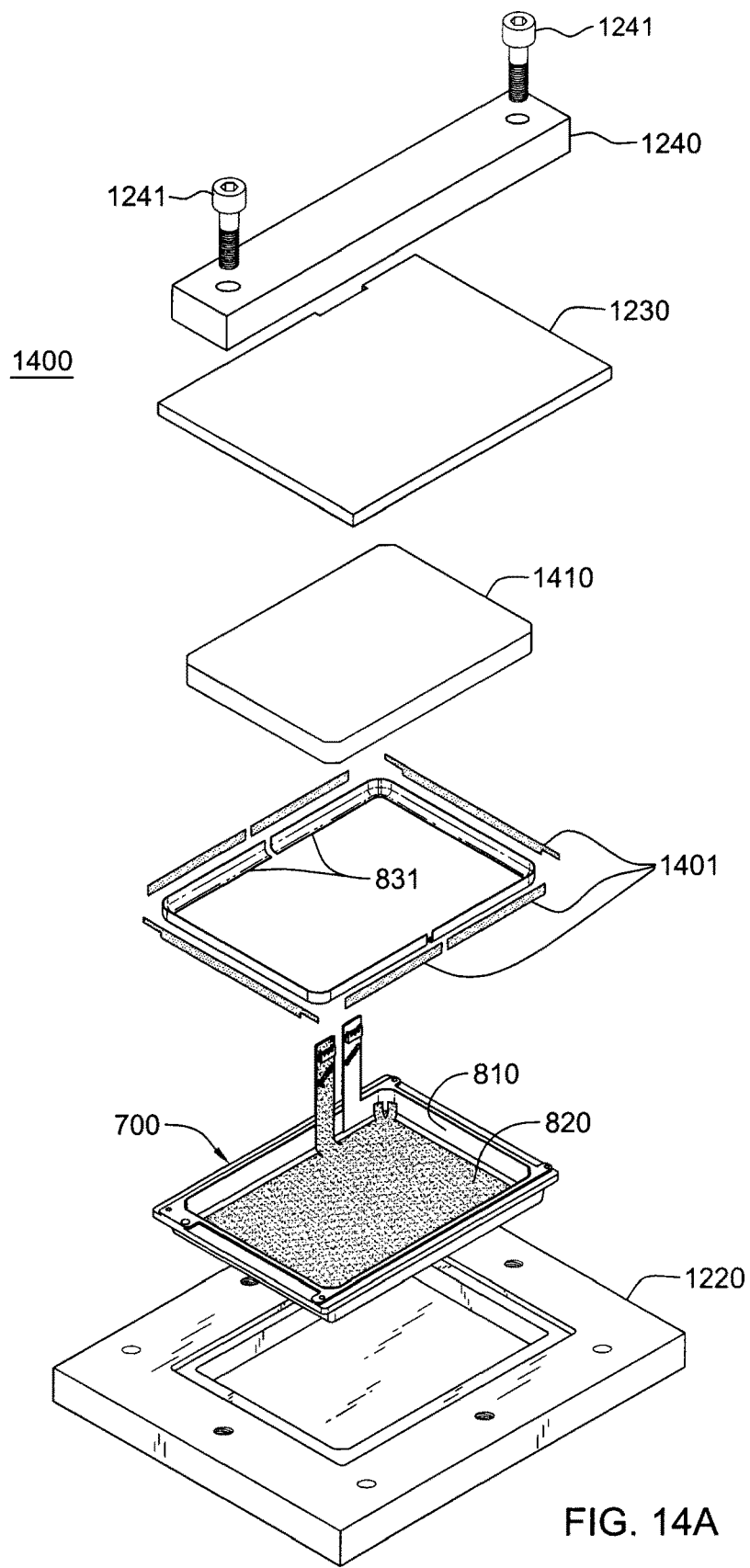
FIG. 14A depicts an exploded view of an assembly apparatus for affixing, for instance, a security element(s) about the inner perimeter of the electronic enclosure over the inner-sidewall tamper-respondent sensor and an inner main surface tamper-respondent sensor, in accordance with one or more aspects of the present invention.

By way of example, FIGS. 12A-12C depict an assembly apparatus and process for adhering inner-sidewall tamper-respondent sensor 810 to the inner-sidewall of electronic enclosure 700, while FIGS. 13A-13C illustrate an assembly apparatus and process for adhering an inner main surface tamper-respondent sensor to the inner main surface of the electronic enclosure, and FIGS. 14A-14C depict one embodiment of an assembly apparatus and process for securing a security element(s) around the inner perimeter of the electronic enclosure over, for instance, the inner main surface tamper-respondent sensor and/or inner-sidewall tamper-respondent sensor.

Referring collectively to FIGS. 12A-12C, assembly apparatus 1200 includes a pressure cure fixture or element 1210 designed and sized to reside within electronic enclosure 700 and facilitate applying pressure during curing to an adhesive 1201 overlying the inner-sidewall surface of electronic enclosure 700. By way of example, adhesive 1201 may be an adhesive sheet layer that is similarly sized to inner-sidewall tamper-respondent sensor 810 to be secured to the inner-sidewall of electronic enclosure 700. The adhesive sheet layer may be, for instance, a few millimeters smaller in width or height than the inner-sidewall tamper-respondent sensor 810, with constant pressure desired during the curing process to ensure good adhesion of the tamper-respondent sensor to the inner-sidewall of the electronic enclosure. Commercially available adhesive sheet layers may be employed. For instance, a 3M Scotch-Weld™ Structural Adhesive Film AF163-2 could be employed for adhesive 1201. This material, which is available from 3M Corporation of Saint Paul, Minn., USA, has good bond strength, and high fracture toughness and peel strength. Further, the material has good resistance to moisture, has a short cure time, for instance, 125° C. for 90 minutes, and is capable of low pressure bonding. The material is also X-ray opaque. Note, however, that this is only one example of adhesive 1201 which could be employed in the assembly apparatuses and processes disclosed herein. In one or more implementations, adhesive 1201, such as the above-noted adhesive sheet layer, may be placed into the electronic enclosure over the inner-sidewall of the enclosure and the inner-sidewall tamper-respondent sensor 810 may then be placed over the adhesive 1201 within electronic enclosure 700.

As depicted, pressure cure fixture 1210 is sized to correspond, at least in part, to the inner space of electronic enclosure 700, while still allowing for adhesive 1201 and inner-sidewall tamper-respondent sensor 810 to be disposed between pressure cure fixture 1210 and electronic enclosure 700. By way of example, pressure cure fixture 1210 could be configured to substantially fill the inner space of electronic enclosure 700 with adhesive 1201 and inner-sidewall tamper-respondent sensor 810 disposed therein. For instance, pressure cure fixture 1210 may be configured, designed and sized so that at room temperature, the fixture readily slides into the inner space of electronic enclosure 700. Any spacing or gap between pressure cure fixture 1210 and, for instance, inner-sidewall tamper-respondent sensor 810 may be dependent, for instance, on the particular material of the pressure cure fixture selected as the high coefficient of thermal expansion (CTE) material, relative to the coefficient of thermal expansion of the electronic enclosure 700. As one example only, the material of pressure cure fixture 1210 could be a silicone sponge rubber material, such as the sponge rubber materials offered by Diversified Silicone Products, Inc. of Santa Fe Springs, Calif., USA, and electronic enclosure 700 may be formed of a metal, such as aluminum. The density of the silicone sponge rubber may be selected to achieve a desired force exerted on the adhesive for a given set of cure conditions. For instance, an applied force in the range of 5-20 pounds may be achieved.

In the embodiment depicted, assembly apparatus 1200 may further include a base fixture 1220, upper fixture 1230 and clamp 1240 with bolts 1241 to secure the assembly together in fixed relation, for instance, for placement within a curing oven. In one or more embodiments, upper fixture 1230 may be configured to accommodate the integrated flex ribbon cable or extension 811 of inner-sidewall tamper-respondent sensor 810. For instance, upper fixture 1230 and/or pressure cure fixture 1210 could be provided with one or more recesses or cutouts to accommodate the extension when assembled as depicted in FIG. 12C. Alternatively, upper fixture 1230 and/or pressure cure fixture 1210 could include an appropriately located recess to allow for integrated flex extension 811 to bend over within the assembly during the curing process.

As noted, FIGS. 13A-13C illustrate one embodiment of an assembly apparatus and process for adhering an inner main surface tamper-respondent sensor 820 to an inner main surface of electronic enclosure 700. In the depicted implementation of FIGS. 13A-13C, a different assembly apparatus 1300 is presented which includes a pressure cure fixture 1310, base fixture 1320, and upper fixture 1330, which may be secured, such as in the depicted embodiment, to pressure cure fixture 1310. A clamp or attachment mechanism, such as one or more bolts 1332, may be employed to secure the assembly apparatus together, as explained further below. Note that the assembly apparatus 1300 and process of FIGS. 13A-13C are presented by way of example only as part of forming a tamper-respondent assembly, such as described above in connection with FIGS. 7-11. As noted above, the assembly apparatuses and processes disclosed herein could be readily adapted to facilitate securing any surface-mount element to an inner surface of many different types of containers, one embodiment of which would be electronic enclosure 700. In FIGS. 13A-13C, inner main surface tamper-respondent sensor 820 is to be adhered to an inner main surface of electronic enclosure 700 using an adhesive 1301, such as a liquid adhesive.

Pressure cure fixture or element 1310 is configured, designed and sized to reside within electronic enclosure 700, with inner-sidewall tamper-respondent sensor 810 positioned as depicted in FIG. 13A, and with inner main surface tamper-respondent sensor 820 disposed between pressure cure fixture 1310 and electronic enclosure 700. Pressure cure fixture 1310 may be formed of a material selected to have a high coefficient of thermal expansion (CTE) compared with the material(s) of electronic enclosure 700. As noted, once assembled, the assembly may be placed within an oven for curing of the adhesive 1301, and as temperature rises, the high CTE material of pressure cure fixture 1310 expands at a rate much higher than that of electronic enclosure 700, and thereby exerts a desired force towards the inner surface of the electronic enclosure facilitating pressure curing of, for instance, the inner main surface tamper-respondent sensor 820 to the inner main surface of electronic enclosure 700.

By way of example, adhesive 1301 may be a liquid adhesive with enhanced thermal conduction properties compared with, for example, adhesive 1201 (FIG. 12A) securing the inner-sidewall tamper-respondent sensor to the inner-sidewall of electronic enclosure 700. In one or more implementations, the inner main surface tamper-respondent sensor 820 may be placed in direct contact with one or more heat generating electronic components within the secure volume being defined, in part, by the tamper-respondent assembly. Alternatively, one or more heat sinks may be in contact with the inner main surface tamper-respondent sensor 820 when the tamper-respondent assembly or tamper-proof electronic package is assembled.

As one example, adhesive 1301 may comprise a Master Bond Supreme 10AOHTXT black adhesive with, for instance, aluminum oxide as a filler to provide the adhesive with enhanced thermal conductivity properties. This adhesive is available from Master Bond, Inc. of Hackensack, N.J., USA. The material has good bond strength and a relatively short cure time, for instance, 125° C. for 90 minutes. As with the above-described material, adhesive 1301 is capable of relatively low pressure bonding (for instance, in the range of 5-20 pounds). Note, however, that this adhesive 1301 example is one example only of an adhesive which could be employed in the assembly apparatuses and processes disclosed herein. Further, note that in one or more implementations, the pattern of adhesive 1301 applied to the inner surface of electronic enclosure 700 may be configured or designed based upon placement of heat generating components within the secure volume. For instance, in the design depicted in FIG. 13A, a higher heat generating electronic component in the middle of the container 700 is assumed such that the adhesive pattern facilitates spreading of any heat conducted across the inner main surface tamper-respondent sensor outward across the inner surface of the electronic enclosure 700.

In operation, electronic enclosure 700 with inner-sidewall tamper-respondent sensor 810 affixed thereto may be prepared with adhesive 1301 and placed into base fixture 1320, that is, into an opening configured and sized to receive electronic enclosure 700. Inner main surface tamper-respondent sensor 820 may then be placed into electronic enclosure 700 over adhesive 1301. Upper fixture 1330 with pressure cure fixture 1310 mounted thereto may then be placed in position over the subassembly using alignment pins 1321 projecting from base fixture 1320 and alignment openings 1331 in upper fixture 1330. In this configuration, pressure cure fixture 1310 projects downward and substantially fills the inner space of electronic enclosure 700, with inner main surface tamper-respondent sensor 1820 and inner-sidewall tamper-respondent sensor 1810 disposed between the fixture and the inner surface of electronic enclosure 700. One or more bolts 1332 may be employed to clamp or affix the upper and lower fixtures together for placement of the assembly into a curing oven.

In one or more implementations, pressure cure fixture 1310 may be formed of teflon so that should any liquid adhesive 1301 contact the pressure cure fixture, it would not adhere to the fixture and prevent or inhibit disassembly of the assembly apparatus after curing of the adhesive. Note also, in one or more implementations, the upper fixture may include or be subject to spring biasing. For instance, a spring biasing plate (not shown) could be disposed over the upper fixture and be affixed to the base fixture, to facilitate spring biasing of the upper fixture towards the base fixture to, for instance, apply uniform pressure to the pressure cure fixture to force the fixture towards, for instance, the inner main surface of the container.

By way of further example, FIGS. 14A-14C depict one embodiment of an assembly apparatus 1400 and process for securing, for instance, security element(s) 831 around the inner perimeter of the electronic enclosure 700 over, for instance, the inner main surface tamper-respondent sensor 820 and/or inner-sidewall tamper-respondent sensor 810. By way of example, in this configuration, the assembly apparatus of FIGS. 12A-12C may be reused with, for instance, a slightly reduced size pressure cure fixture 1410 compared with pressure cure fixture 1210 of FIGS. 12A-12C. In particular, the assembly apparatus 1400 may include base fixture 1220, upper fixture 1230 and clamp 1240 with bolts 1241 to secure the assembly together before placement within a cure oven.

Referring collectively to FIGS. 14A-14C, assembly apparatus 1400 includes a pressure cure fixture 1410 designed and sized to reside within electronic enclosure 700 and facilitate applying pressure during curing to, for instance, security element 831 and adhesive 1401 overlying, for instance, one or more of the inner main surface tamper-respondent sensor and inner-sidewall tamper-respondent sensor. By way of example, adhesive 1401 may be an adhesive sheet layer that is similarly sized to security element(s) 831 to be secured about the inner perimeter of electronic enclosure 700. The adhesive sheet layer may be, for instance, a few millimeters smaller in width or height than the security element(s) 831, with constant pressure desired during the curing process to ensure good adhesion of the security element(s) 831 to, for instance, one or more of the inner-sidewall tamper-respondent sensor 810 and inner main surface tamper-respondent sensor 820. Commercially available sheet layers may be employed, such as the above-referenced 3M Scotch-Weld™ Structural Adhesive Films. Note, however, that this is only one example of an adhesive 1401 which may be used to secure the security element(s) 831 within the electronic enclosure about the inner perimeter.

As with the examples above, pressure cure fixture 1410 is sized to correspond, at least in part, to the inner space of electronic enclosure 700, while still allowing for the inner-sidewall tamper-respondent sensor 810, inner main surface tamper-respondent sensor 820, adhesive 1401 and security element(s) 831 to be disposed between the pressure cure fixture and the inner surface of the electronic enclosure, as illustrated. By way of example only, the material of pressure cure fixture 1410 could again be a silicone sponge rubber material, such as the above-discussed sponge rubber materials offered by Diversified Silicone Products, Inc. Alternatively, the material of pressure cure fixture 1410 could be formed of teflon, or any other available material with a higher CTE than that of the electronic enclosure 700 so that when placed within the cure oven, a desired pressure is generated from within the electronic enclosure outwards towards the surface-mount element to be adhered within the electronic enclosure 700. As with the assembly apparatuses described above, once assembled together as depicted in FIG. 14C, the assembly may be placed within a curing oven. In one or more embodiments, the pressure cure fixture 1410 and upper fixture 1230 are configured to accommodate the integrated flex ribbon extensions 811, 821. For instance, one or more recesses or cutouts may be provided within the respective fixtures to allow the integrated flex extensions 811, 821 to project outward from the assembly. Alternatively, the upper fixture 1230 and/or pressure cure fixture 1410 could be configured with appropriately located and sized notches to allow for the integrated flex ribbon extensions to be bent over within the assembly during the curing process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An assembly apparatus comprising:
    a pressure cure fixture sized to reside within a container and facilitate applying pressure to an adhesive disposed over an inner surface of the container during curing, the pressure cure fixture being formed of a material with a higher coefficient of thermal expansion (CTE) than the container, and being sized to correspond, at least in part, to an inner space of the container while allowing for the adhesive and a surface-mount element to be disposed between the pressure cure fixture and the inner surface of the container, wherein when heated, the pressure cure fixture expands greater than the container and imparts the pressure to the surface-mount element and the adhesive to facilitate securing the surface-mount element to the inner surface of the container; and
    wherein the container is an electronic enclosure, and the surface-mount element comprises a tamper-respondent sensor.

2. The assembly apparatus of claim 1, wherein the adhesive comprises an adhesive sheet layer, at least one side of the adhesive sheet layer comprising a pressure-sensitive adhesive.

3. The assembly apparatus of claim 2, wherein the material of the pressure cure fixture comprises a silicone sponge rubber.

4. The assembly apparatus of claim 2, wherein the inner surface comprises an inner-sidewall surface of the container, and wherein the surface-mount element mounts to the inner-sidewall surface of the container via the adhesive.

5. The assembly apparatus of claim 1, wherein the adhesive comprises a liquid adhesive to be heat cured.

6. The assembly apparatus of claim 5, wherein the material of the pressure cure fixture comprises polytetrafluoroethylene.

7. The assembly apparatus of claim 1, further comprising a base fixture, upper fixture and clamp, the base fixture including an opening sized to receive the container with the pressure cure fixture, surface-mount element and adhesive disposed therein, and the clamp clamping the upper fixture to the base fixture, and the base fixture, upper fixture and clamp facilitating alignment of the surface-mount element to an edge of the container during the heating to cure the adhesive and imparting the pressure to the surface-mount element and the adhesive.

8. The assembly apparatus of claim 1, wherein the adhesive is a first adhesive, the pressure cure fixture is a first pressure cure fixture, the material of the first pressure cure fixture is a first material, and the surface-mount element is a first surface-mount element, and wherein the assembly apparatus further comprises a second pressure cure fixture to facilitate adhering a second surface-mount element to the inner surface of the container after the first surface-mount element has been adhered to the inner surface of the container, the second pressure cure fixture being formed of a second material with a higher coefficient of thermal expansion (CTE) than the container, the second pressure cure fixture being sized to correspond, at least in part, to the inner space of the container while allowing for the first surface-mount element, the second surface-mount element and a second adhesive to be disposed between the second pressure cure fixture and the inner surface of the container, wherein when heated, the second pressure cure fixture expands greater than the container and imparts pressure to the second surface-mount element and the second adhesive to facilitate securing the second surface-mount element to the inner surface of the container.

9. The assembly apparatus of claim 8, wherein the first material and the second material are different materials, and wherein the first and second adhesives are different types of adhesives, at least one of the different types of adhesives comprising a pressure-sensitive adhesive.

10. The assembly apparatus of claim 9, wherein the different materials of the first and second pressure cure fixtures comprise at least one of silicone or polytetrafluoroethylene.

11. An assembly apparatus comprising:
   a pressure cure fixture sized to reside within an electronic enclosure and facilitate applying pressure to a an adhesive disposed over an inner surface of the electronic enclosure, the pressure cure fixture being formed of a material with a higher coefficient of thermal expansion (CTE) than the electronic enclosure, and being sized to correspond, at least in part, to an inner space of the electronic enclosure while allowing for the adhesive and a tamper-respondent sensor to be disposed between the pressure cure fixture and the inner surface of the electronic enclosure, wherein when heated, the pressure cure fixture expands greater than the electronic enclosure and imparts the pressure to the tamper-respondent sensor and the adhesive to facilitate securing the tamper-respondent sensor to the inner surface of the electronic enclosure; and
   wherein the inner surface comprises an inner-sidewall of the electronic enclosure, and the tamper-respondent sensor comprises an inner-sidewall tamper-respondent sensor sized to cover the inner-sidewall of the electronic enclosure, and wherein the adhesive comprises an adhesive sheet layer, at least one side of the adhesive sheet layer comprising a pressure-sensitive adhesive.

12. The assembly apparatus of claim 11, wherein the material of the pressure cure fixture comprises a silicone sponge rubber.

13. The assembly apparatus of claim 11, wherein the adhesive is a first adhesive, the pressure cure fixture is a first pressure cure fixture, the material of the first pressure cure fixture is a first material, and wherein the assembly apparatus further comprises a second pressure cure fixture to facilitate adhering an inner main surface tamper-respondent sensor to an inner main surface of the electronic enclosure, the second pressure cure fixture comprising a second material with a higher coefficient of thermal expansion (CTE) than the electronic enclosure, and the second pressure cure fixture facilitating applying pressure to the second adhesive during curing, wherein the second pressure cure fixture is sized to correspond, at least in part, to the inner space of the electronic enclosure while allowing for the inner-sidewall tamper-respondent sensor, the first adhesive, the inner main surface tamper-respondent sensor and the second adhesive to be disposed between the second pressure cure fixture and the inner surface of the electronic enclosure, wherein when heated, the second pressure cure fixture expands greater than the electronic enclosure and imparts pressure to the inner main surface tamper-respondent sensor and the second adhesive to facilitate securing the inner main surface tamper-respondent sensor to the inner main surface of the electronic enclosure.

14. The assembly apparatus of claim 13, wherein the first material and the second material are different materials, and wherein the first and second adhesives are different types of adhesives, at least one of the different types of adhesives comprising a pressure-sensitive adhesive.

15. The assembly apparatus of claim 14, wherein at least one of the different materials of the first and second pressure cure fixtures comprises silicone or polytetrafluoroethylene.

16. The assembly apparatus of claim 11, further comprising a base fixture, upper fixture and clamp, the base fixture including an opening sized to receive the electronic enclosure with the pressure cure fixture, tamper-respondent sensor and adhesive disposed therein, the clamp clamping the upper fixture to the base fixture, and the base fixture, upper fixture and clamp facilitating alignment of the tamper-respondent sensor to an edge of the electronic enclosure during the heating imparting the pressure to the tamper-respondent sensor and the adhesive.

17. A fabrication method comprising:
   providing an assembly apparatus, comprising:
      providing a pressure cure fixture sized to reside within a container and facilitate applying pressure to an adhesive disposed over an inner surface of the container during curing, the pressure cure fixture being formed of a material with a higher coefficient of thermal expansion (CTE) than the container, and being sized to correspond, at least in part, to an inner space of the container while allowing for the adhesive and a surface-mount element to be disposed between the pressure cure fixture and the inner surface of the container;
      wherein heating the container with the pressure cure fixture, surface-mount element and adhesive disposed therein expands the pressure cure fixture greater than the container and imparts the pressure to the surface-mount element and the adhesive to facilitate securing the surface-mount element to the inner surface of the container; and
      wherein the adhesive is a first adhesive, the pressure cure fixture is a first pressure cure fixture, the material of the first pressure cure fixture is a first material, and the surface-mount element is a first surface-mount element, and wherein the assembly apparatus further comprises a second pressure cure fixture to facilitate adhering a second surface-mount element to the inner surface of the container after the first surface-mount element has been adhered to the inner surface of the container, the second pressure cure fixture being formed of a second material with a higher coefficient of thermal expansion (CTE) than the container, the second pressure cure fixture being sized to correspond, at least in part, to the inner space of the container while allowing for the first surface-mount element, the second surface-mount element and a second adhesive to be disposed between the second pressure cure fixture and the inner surface of the container,
   wherein when heated, the second pressure cure fixture expands greater than the container and imparts pressure to the second surface-mount element and the second adhesive to facilitate securing the second surface-mount element to the inner surface of the container.

18. The fabrication method of claim 17, wherein the adhesive comprises an adhesive sheet layer, at least one side of the adhesive sheet layer comprising a pressure-sensitive adhesive.

19. The fabrication method of claim 17, wherein the container is an electronic enclosure, and the surface-mount element comprises a tamper-respondent sensor.

* * * * *